(12) United States Patent
Lin et al.

(10) Patent No.: US 9,209,201 B2
(45) Date of Patent: Dec. 8, 2015

(54) SYSTEMS AND METHODS FOR INTEGRATING DIFFERENT CHANNEL MATERIALS INTO A CMOS CIRCUIT BY USING A SEMICONDUCTOR STRUCTURE HAVING MULTIPLE TRANSISTOR LAYERS

(71) Applicant: Taiwan Semiconductor Manufacturing Company Limited, Hsinchu (TW)

(72) Inventors: Yi-Tang Lin, Hsinchu (TW); Clement Hsingjen Wann, New York, NY (US)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 181 days.

(21) Appl. No.: 14/060,678

(22) Filed: Oct. 23, 2013

(65) Prior Publication Data

US 2015/0108575 A1    Apr. 23, 2015

(51) Int. Cl.
*H01L 27/12* (2006.01)
*H01L 21/82* (2006.01)
*H01L 27/092* (2006.01)
*H01L 21/8238* (2006.01)

(52) U.S. Cl.
CPC .... *H01L 27/1207* (2013.01); *H01L 21/823821* (2013.01); *H01L 27/0922* (2013.01); *H01L 27/0924* (2013.01)

(58) Field of Classification Search
CPC . H01L 27/11; H01L 27/0688; H01L 27/1108; H01L 27/12; H01L 27/1027; H01L 27/0922; H01L 27/0924; H01L 21/8221; H01L 21/823821; H01L 21/84
USPC ........................................... 438/153; 257/351
See application file for complete search history.

(56) References Cited

U.S. PATENT DOCUMENTS 7,402,897 B2 *   7/2008   Leedy ........................ B81B 7/02
                                                                    257/678

* cited by examiner

*Primary Examiner* — Monica D Harrison
(74) *Attorney, Agent, or Firm* — Jones Day

(57) ABSTRACT

A multilayer semiconductor structure having a layout footprint with a first region and a non-overlapping second region and different transistor types fabricated using different channel material. The semiconductor structure comprises a first transistor layer comprising a first type of channel material in the first region but no channel material in the second region. The semiconductor structure further comprises a second transistor layer comprising a second type of channel material in the second region but no channel material in the first region. The second transistor layer is vertically elevated above the first transistor layer. A first transistor is fabricated on the first transistor layer. A second transistor is fabricated on the second transistor layer, and the first transistor is interconnected with the second transistor to form a circuit.

21 Claims, 41 Drawing Sheets

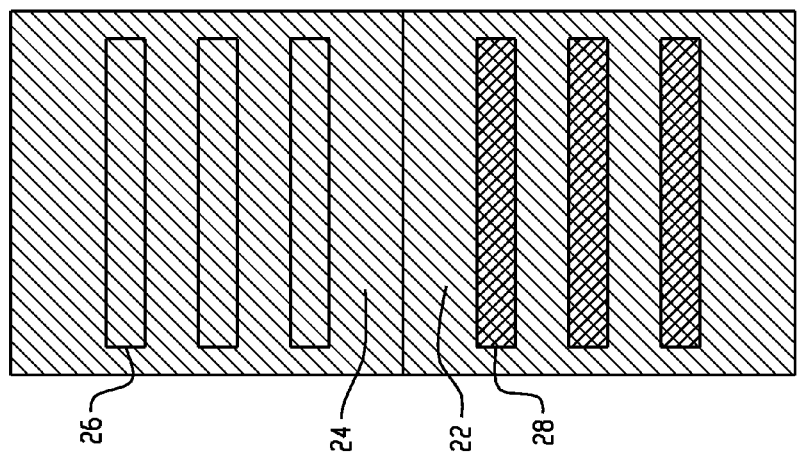
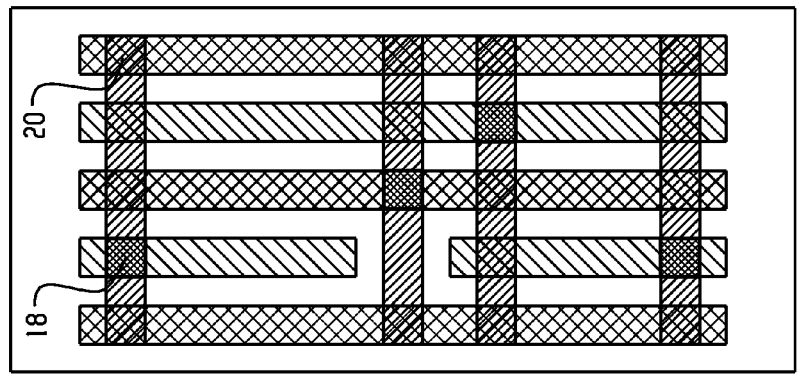
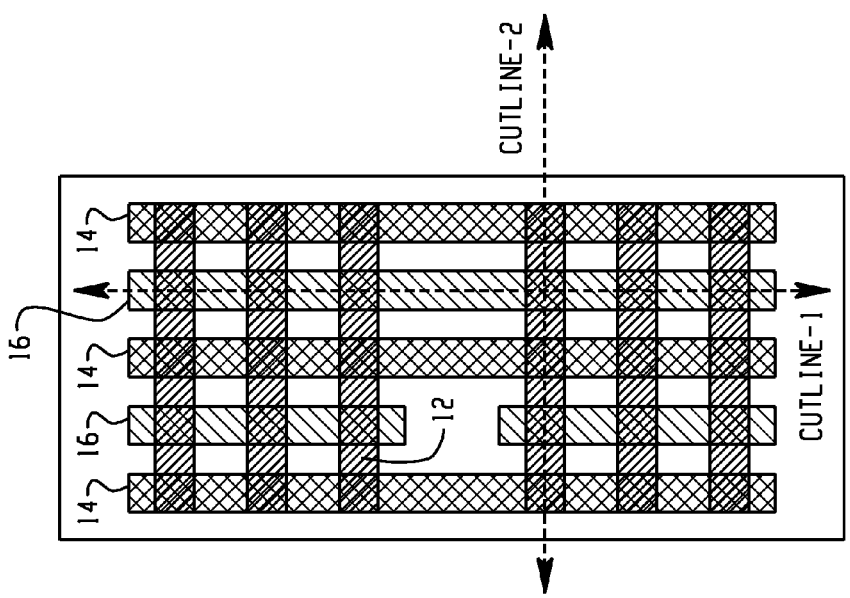
Fig. 2C
Fig. 2B
Fig. 2A

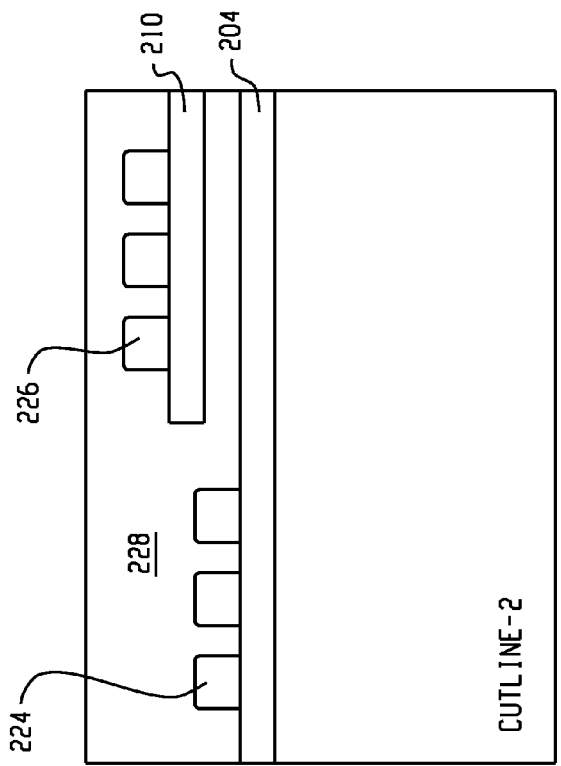
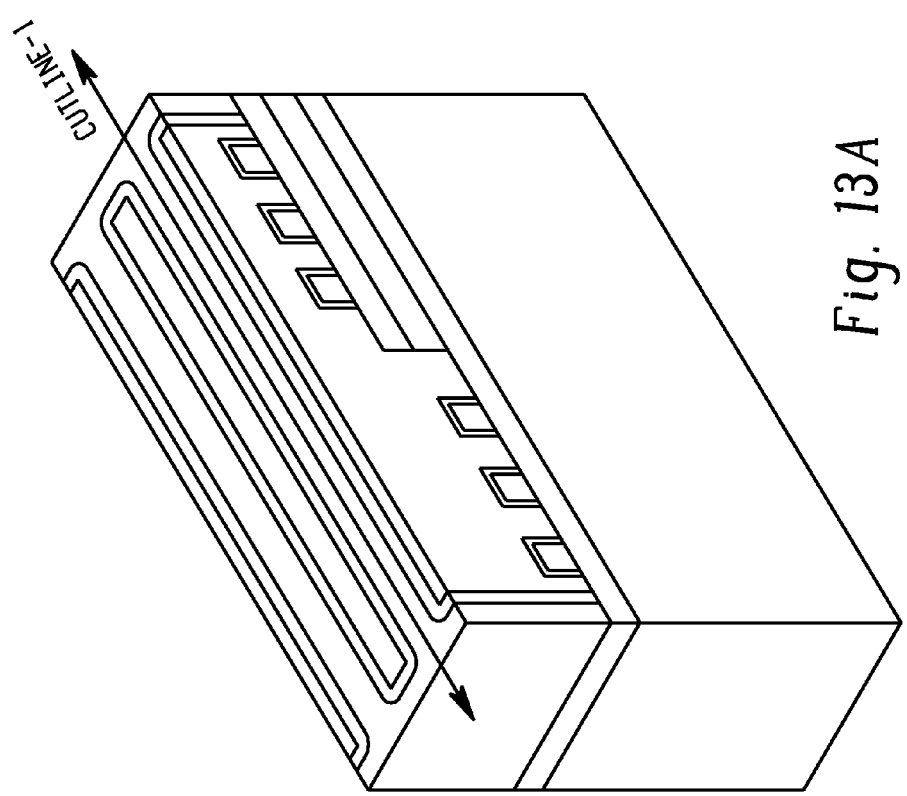
Fig. 13B
Fig. 13A

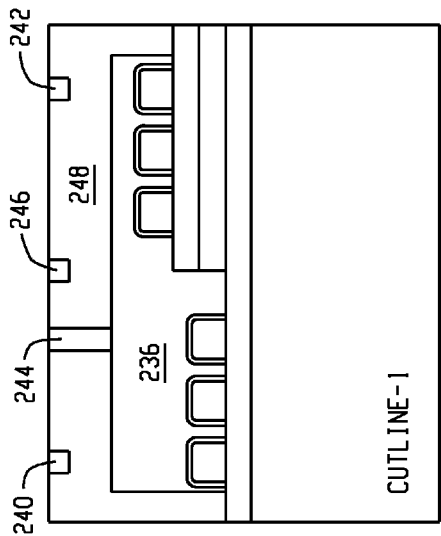
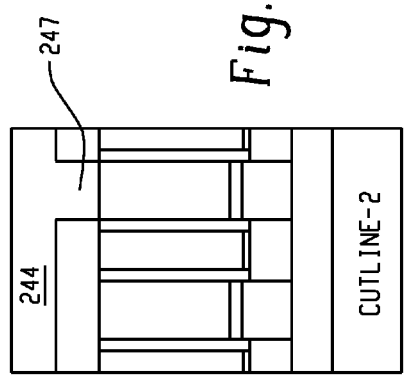
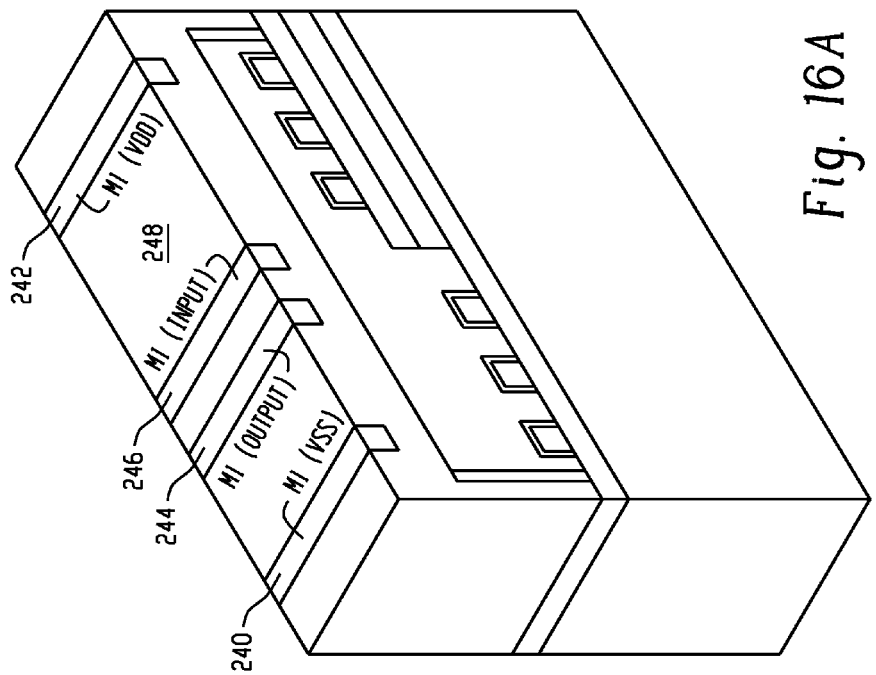
Fig. 16B
Fig. 16C
Fig. 16A

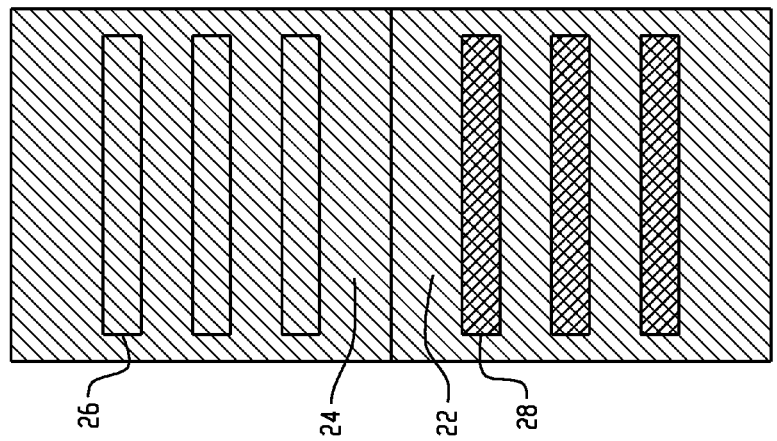
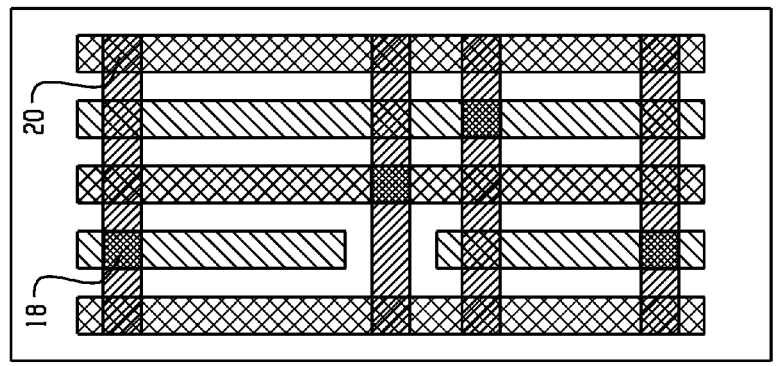
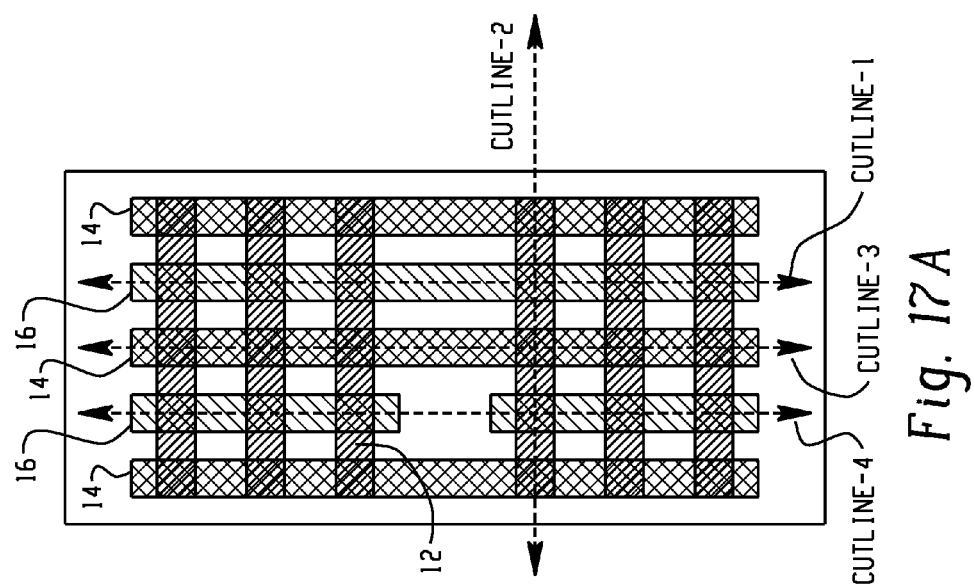

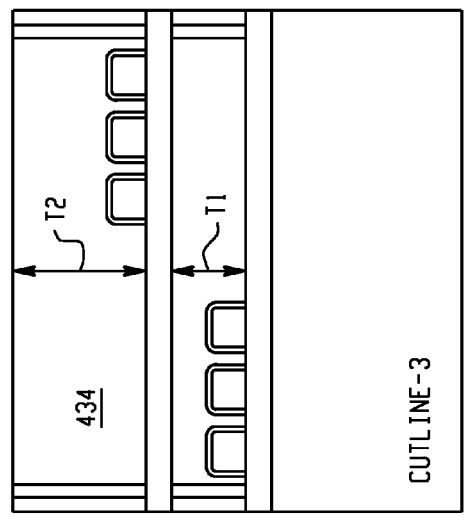
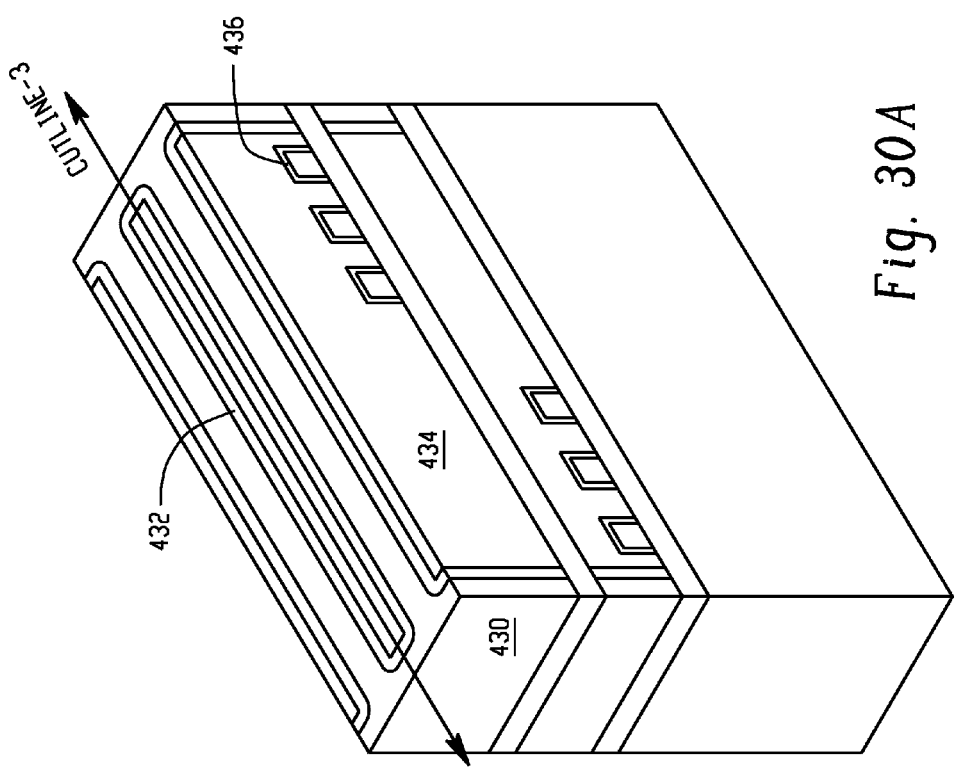
Fig. 30A
Fig. 30B

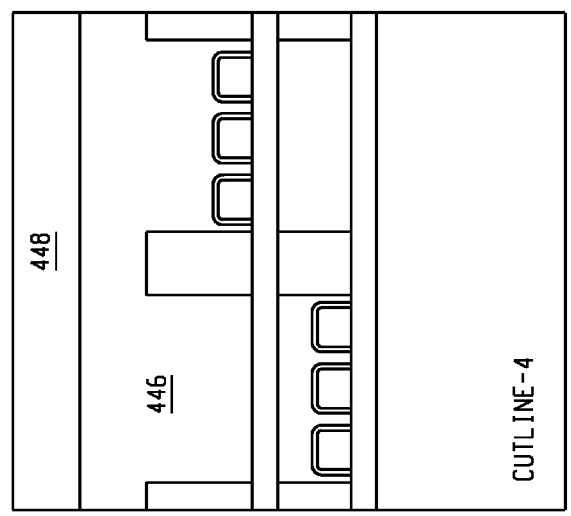
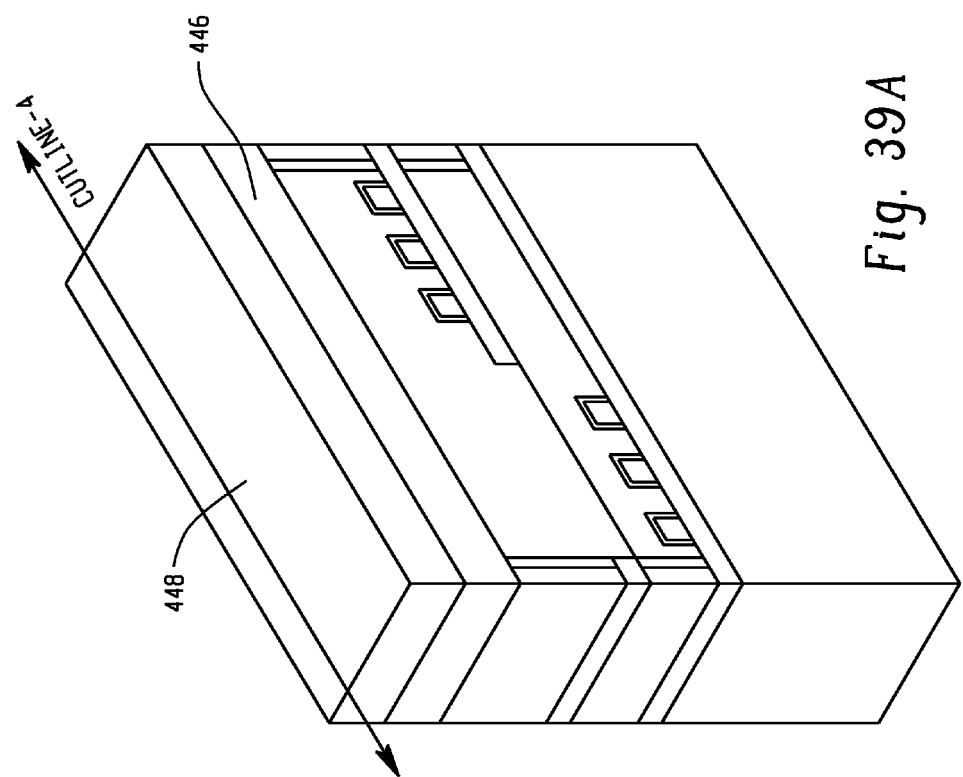
Fig. 39A
Fig. 39B

US 9,209,201 B2

SYSTEMS AND METHODS FOR INTEGRATING DIFFERENT CHANNEL MATERIALS INTO A CMOS CIRCUIT BY USING A SEMICONDUCTOR STRUCTURE HAVING MULTIPLE TRANSISTOR LAYERS

FIELD

The technology described in this patent document relates generally to semiconductor devices and more particularly to a semiconductor structure having multiple transistor layers with different channel material in each transistor layer.

BACKGROUND

Integrated circuits ("ICs") may comprise one or more types of semiconductor transistors such as n-channel MOSFET ("NMOS") transistors and p-channel MOSFET ("PMOS") transistors. NMOS transistors and PMOS transistors have different performance characteristics. There are some types of channel material that are better suited for NMOS transistors and other types of channel material that are better suited for PMOS transistors.

SUMMARY

In accordance with the teachings described herein, system and methods are provided for a semiconductor structure having multiple semiconductor device layers. In one example, a multilayer semiconductor structure having a layout footprint with a first region and a non-overlapping second region and different transistor types fabricated using different channel material. The semiconductor structure comprises a first transistor layer comprising a first type of channel material in the first region but no channel material in the second region. The semiconductor structure further comprises a second transistor layer comprising a second type of channel material in the second region but no channel material in the first region. The second transistor layer is vertically elevated above the first transistor layer. A first transistor is fabricated on the first transistor layer. A second transistor is fabricated on the second transistor layer, and the first transistor is interconnected with the second transistor to form a circuit.

In another example, a method of fabricating a multilayer semiconductor structure having a layout footprint with a first region and a non-overlapping second region and different transistor types fabricated using different channel material. The method comprises providing a wafer with a first channel material above a buried oxide layer. The method further comprises transforming the first channel material in the second region to an oxidation layer, bonding a second buried oxide layer with a second channel material above the second buried oxide layer to the top surface of the first channel material in the first region and the oxidation layer in the second region, removing the second channel material and the second buried oxide layer from the first region, and fabricating a first transistor type in the first region and a second transistor type in the second region.

In yet another example, a method of fabricating a multi-layer semiconductor structure having a layout footprint with a first region and a non-overlapping second region and different transistor types fabricated using different channel material. The method comprises providing a wafer with first channel material above a buried oxide layer, fabricating a first transistor layer with a first transistor in the first region and the first channel material removed from the second region, and bonding a second buried oxide layer with a second channel material above the second buried oxide layer to the top surface of the fabricated first transistor layer. The method further comprises fabricating a second transistor layer with a second transistor in the second region and the second channel material removed from the first region and selectively removing a portion of the second buried oxide layer from the first region to provide a terminal of the first transistor with a direct conduction path to a metal contact layer.

BRIEF DESCRIPTION OF THE DRAWINGS

FIGS. 2A-2C are block diagrams of example masks that may be used to fabricate the example circuit.

FIGS. 4-16C are drawings depicting example states of a semiconductor structure during fabrication of a multilayer semiconductor structure.

FIGS. 17A-17C are block diagrams of example masks that may be used to fabricate the example circuit.

FIGS. 21-45D are drawings depicting example states of a semiconductor structure during fabrication of a multilayer semiconductor structure.

DETAILED DESCRIPTION

Figure 1:
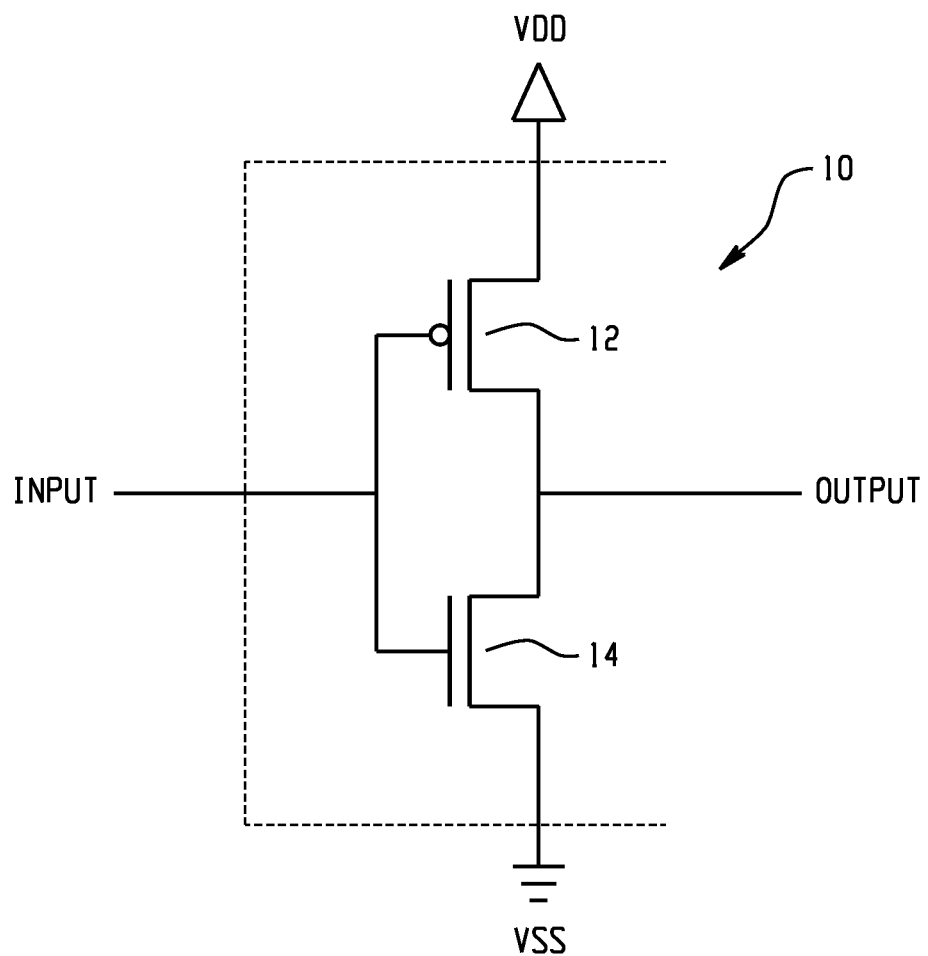
FIG. 1 is a schematic diagram of an example circuit 10 that may be implemented in a multi-layer semiconductor structure.

FIG. 1 is a schematic diagram of an example circuit 10 that may be implemented in a multi-layer semiconductor structure. The example circuit 10 performs an inverter logic function and comprises a PMOS transistor 12 and a NMOS transistor 14.

FIGS. 2A-2C are block diagrams of example masks that may be used to fabricate the example inverter circuit 10 depicted in FIG. 1. FIG. 2A depicts an example mask that can be used for the structure related layers such as OD (defining the active region), gate (providing the gate electrode to form active devices) and M0 (providing interconnection at ground level). FIG. 2B depicts an example mask that can be used for the back end of line ("BEOL") related layers such as M1 (providing interconnection at the first level) and Via0 (providing interconnection for the first and ground levels). FIG. 2C depicts an example mask that can be used for the implantation related layers such as P-well, N-well, n+S/D, and p+S/D. In particular, the OD mask portions are depicted at 12, the Gate mask portions are depicted at 14, the M0 mask portions are depicted at 16, the Via0 mask portions are depicted at 18, the M1 mask portions are depicted at 20, the P-Well implantation mask portions are depicted at 22, the N-Well implantation mask portions are depicted at 24, the P+ implantation mask portions are depicted at 26, and the N+ implantation mask portions are depicted at 28. The layout/design and masks provided in FIGS. 2A-2C may be used for fabricating a conventional semiconductor structure, that is, in which all of the transistors are fabricated on a single transistor layer. In addition, the same masks and layout may also be used for fabricating a semiconductor structure having multiple transistor layers b appropriately integrating the process flow.

Figure 3:
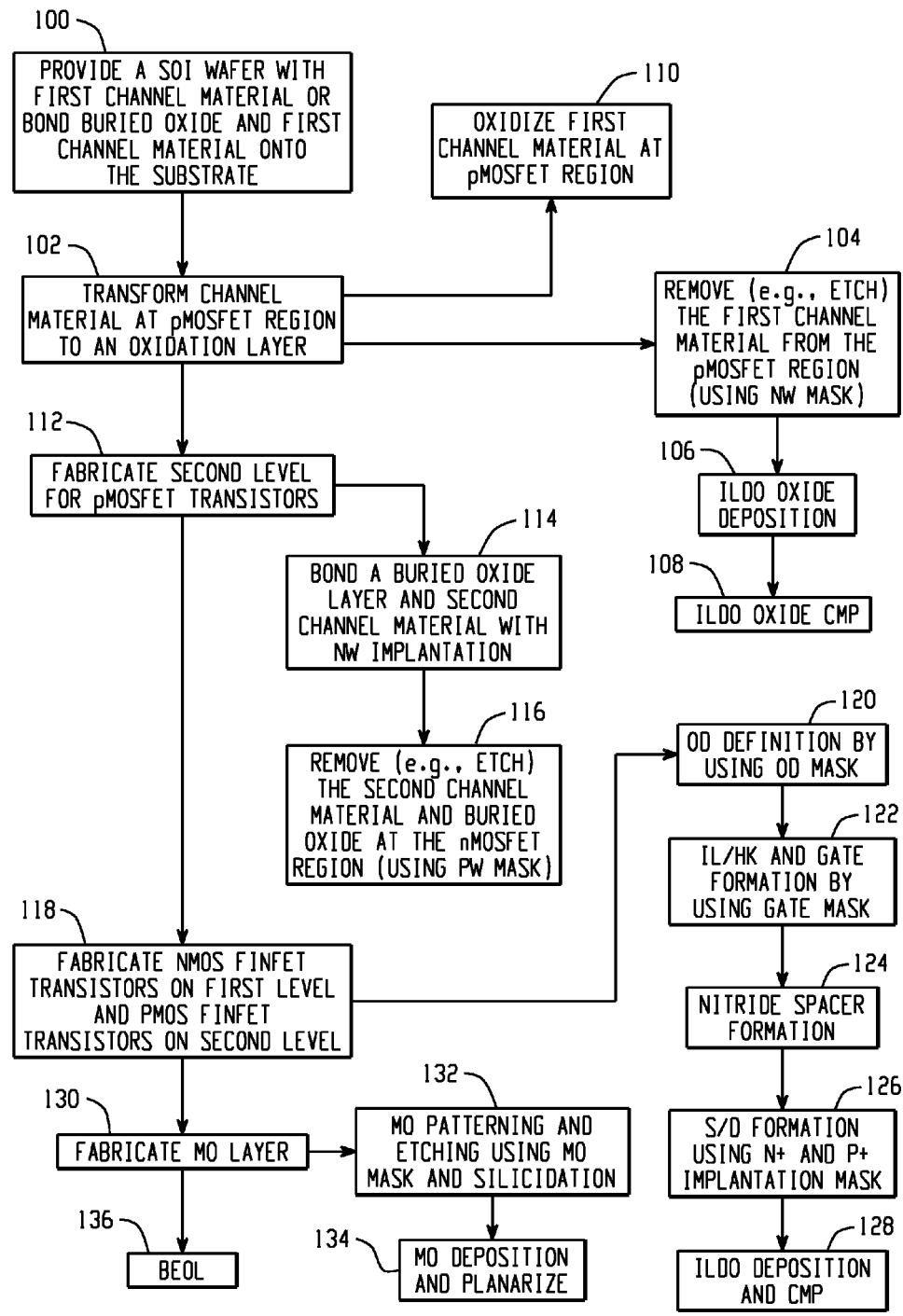
FIG. 3 is a process flow chart depicting example methods for generating a multilayer semiconductor device structure.

FIG. 3 is a process flow chart depicting example methods for generating the example inverter in a multilayer semiconductor device structure. Because the example converter comprises a PMOS transistor and a NMOS transistor, the NMOS transistor in this example is fabricated using a first channel material on a first transistor level and the PMOS transistor is fabricated using a second channel material on a second transistor level. Alternatively, the PMOS transistor can be fabricated using a first channel material on a first transistor level and the NMOS transistor can be fabricated using a second channel material on a second transistor level.

At operation 100, a first semiconductor-on-insulator ("SOI") wafer with the first channel material is provided for the first layer. Alternatively, at operation 100, a substrate with bond buried oxide and the first channel material may be provided.

The first channel material in the region where the PMOS transistor will be fabricated is transformed to an oxidation layer (operation 102). The transformation may comprise removing the first channel material from the PMOS region (operation 104), for example, by an etch process using an N-well mask such as that depicted in FIG. 2C. The first channel material removal may be followed by interlayer dielectric ("ILD0") oxide deposition (operation 106) and ILD0 oxide chemical mechanical polishing/planarization ("CMP") (operation 108). Alternatively, the transformation may comprise oxidizing the first channel material at the PMOS region directly (operation 110). The transformation results in the forming of an isolation region. Forming this isolation region can prevent the formation of a non-ideal parasitic capacitor at the boundary between the n-region and p-region.

Next, a second transistor level with second channel material is fabricated (operation 112). This comprises bonding a semiconductor on insulator ("SOI") substrate onto the surface of the first wafer (operation 114). The SOI substrate in this example comprises a buried oxide layer and a second channel material with N-well implantation. The bottom surface of the insulator of the SOI substrate is bonded to the top surface of the first semiconductor layer using a glue layer such as boro-silicate-glass ("BSG"), phospho-silicate-glass ("PSG") and boro-phospho-silicate-glass ("BPSG"). In some embodiments, the bonding surface of the insulator and patterned surface of the first semiconductor layer are processed to clean, remove excess particles, and make the surfaces hydrophobic or hydrophilic. After the surfaces are processed, the wafer containing the first semiconductor layer and the wafer containing the SOI substrate are aligned. After alignment the layers can be bonded through a touch and press process. The Van der Waals force will link the atoms of the interface between the bottom of the second semiconductor layer and the top of the first semiconductor layer together (this process may involve some plasma enhancement technique). Also a thermal annealing procedure can be applied to enhance the linking of atoms at the interface. The resultant semiconductor structure can have a planarization process or CMP process applied to reduce the thickness of second semiconductor layer to the required thickness.

The buried oxide of the SOI structure functions as an electrical insulator underneath the semiconductor channel material. The buried oxide may be formed from material such as $SiO_2$, HfO, $Al_2O_3$ or other suitable oxide material. The electrical insulator functions to insulate the second channel material in the second semiconductor substrate from the devices formed on the first semiconductor device layer.

The second channel material may be formed from material such as Si, SiGe, GaAs, or others. In this example, the second channel material is different from the material used for the first channel material.

The second channel material in the NMOS region is removed at operation 116. The removal can be accomplished, for example, by an etch process using the P-well mask such as that depicted in FIG. 2C. The second channel material removal results in first channel material in the NMOS region and second channel material in the PMOS region.

After the two channel material levels are formed, an NMOS transistor can be fabricated on the first level and a PMOS transistor on the second level (operation 118). The bi-level transistor fabrication may comprise OD definition by using OD mask (operation 120), interfacial layer/High-K dielectric ("IL/HK") and gate formation using the gate mask (operation 122), nitride spacer formation (operation 124), source/drain formation using N+ and P+ implantation mask (operation 126), and ILD0 oxide deposition and ILD0 oxide CMP (operation 128). The OD definition comprises OD fins formation for the NMOS transistor on the first channel level and OD fins formation for the PMOS transistor on the second channel level.

Following fabrication of the transistors, the metallization layer ("M0") can be fabricated (operation 130). M0 fabrication may comprise M0 patterning and etching using the M0 mask and salicidation (operation 132) and M0 deposition and planarizing (operation 134). After M0 layer fabrication, back-end-of-line ("BEOL") operations may take place (operation 136), where the individual devices are interconnected with wiring on the multi-layer semiconductor structure. BEOL may include fabrication of contacts, insulating layers (dielectrics), metal levels, and bonding sites for chip-to-package connections.

Figure 4:
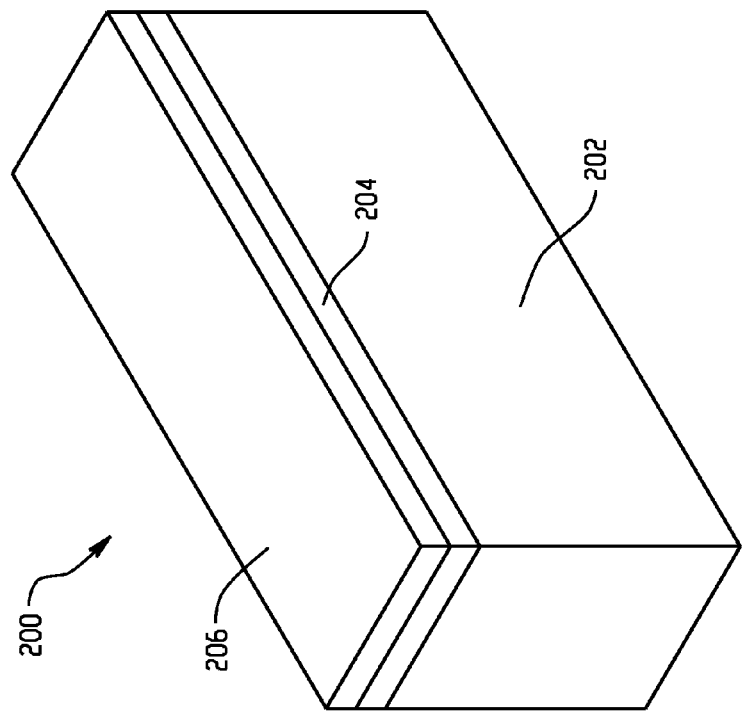

FIG. 4 depicts an isometric view of an example SOI wafer 200 that may be provided for use with the methods described in FIG. 2 to fabricate the circuit of FIG. 1 in a multi-layer semiconductor structure. The SOI wafer 200 comprises a substrate 202 with a buried oxide layer 204 and first channel material 206 over the buried oxide layer 204. The first channel material may comprise silicon with P-well implantation.

Figure 5:
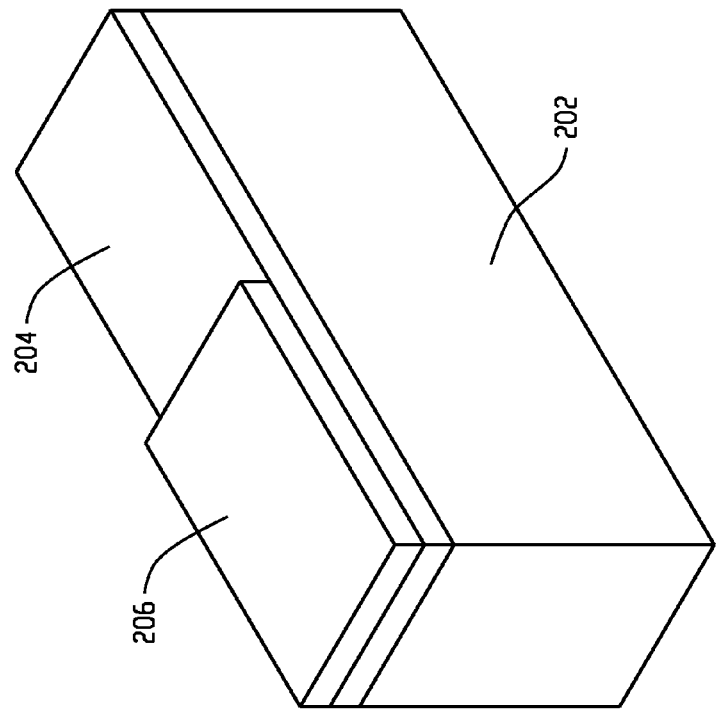

FIG. 5 depicts an isometric view of a portion of the SOI wafer 200 after operations such as etching (operation 104 of FIG. 3) to remove the first channel material 206 from the PMOS region have been performed. Shown is the SOI wafer 200 with the first channel material 206 in the NMOS region but removed from the PMOS region.

Figure 6:
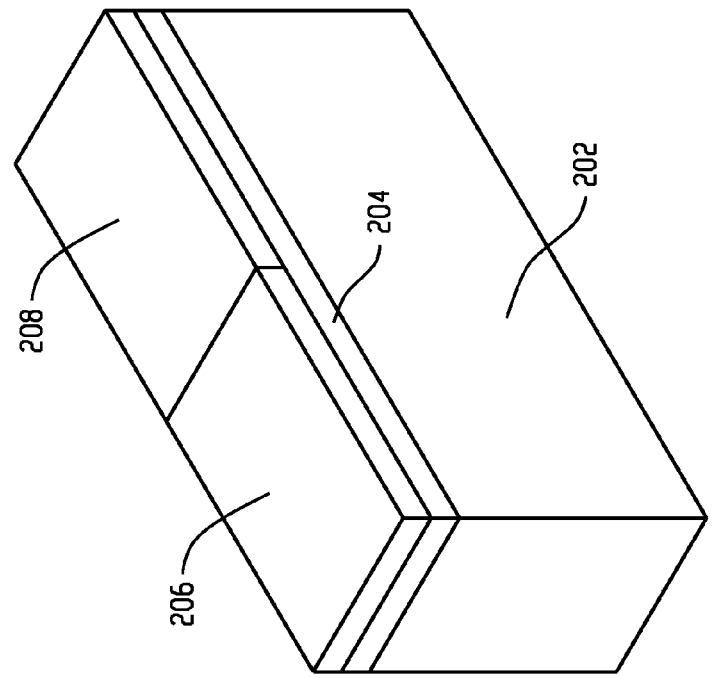

FIG. 6 depicts an isometric view of a portion of the SOI wafer 200 after ILD0 depositing operations (operation 106 of FIG. 3) have been performed. Shown is the SOI wafer 200 with the ILD0 material 208 deposited over the first channel material 206 in the NMOS region and deposited over the buried oxide layer 204 in the PMOS region.

Figure 7:
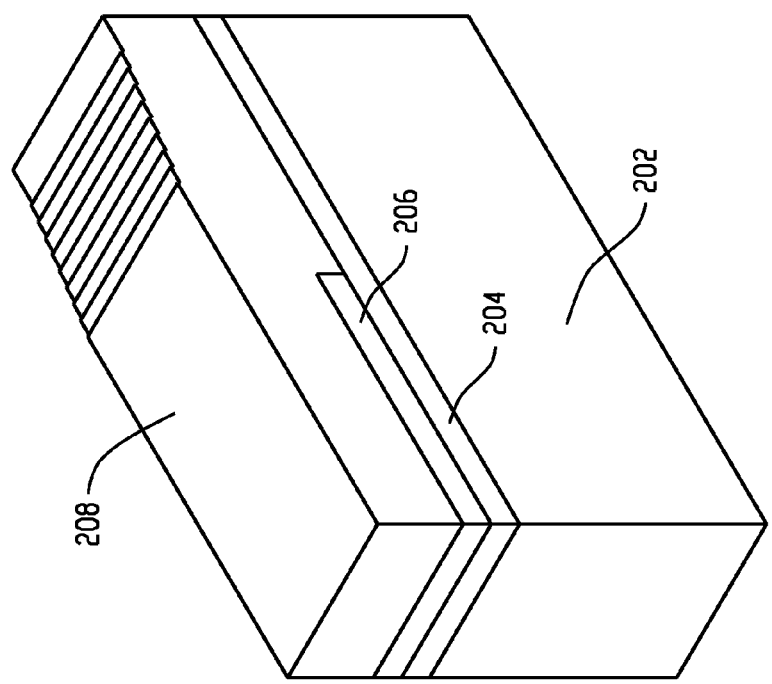

FIG. 7 depicts an isometric view of a portion of the SOI wafer 200 after ILD0 CMP operations (operation 108 of FIG. 3) have been performed. Shown is the SOI wafer 200 with the ILD0 material 208 deposited over the buried oxide layer 204 in the PMOS region. The ILD0 has been polished down to the height of the first channel material 206.

Figure 8:
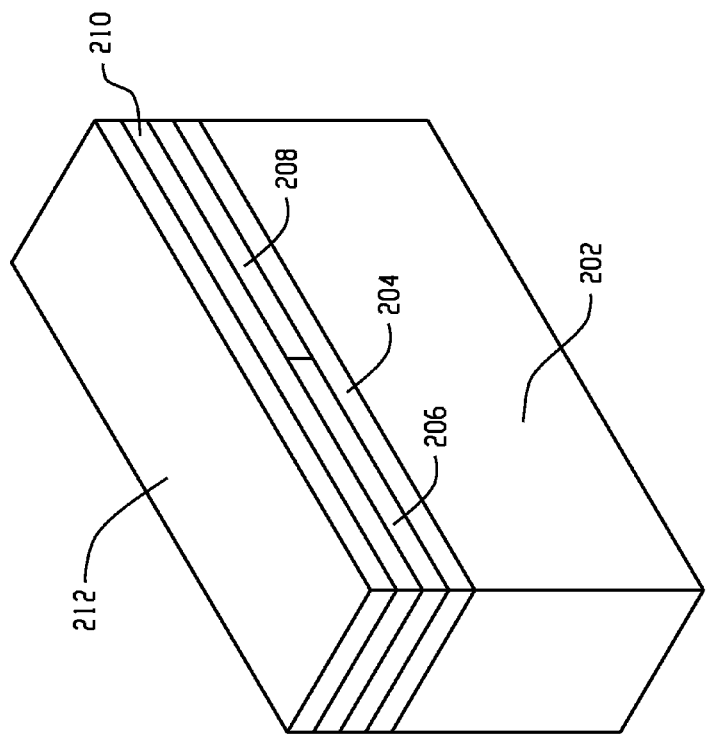

FIG. 8 depicts an isometric view of a portion of the semiconductor structure after the second SOI film stack has been bonded to the top layer of the first SOI wafer (operation 114 of FIG. 3). Shown is the semiconductor structure with the second channel material 212 formed over the buried oxide layer 210 and the buried oxide layer 210 bonded to the first channel material 206 in the NMOS region and the ILD0 material 208 in the PMOS region. The second channel material in the example is a high quality single crystal material made from SiGe with N-well implantation. The N-well implantation is introduced and annealed when preparing the bonding wafer. The buried oxide may be made from material such as $Al_2O_3$ or $HfO_2$. This may avoid the thermal budget of long-period crystal epitaxial process and dopant activation.

Figure 9:
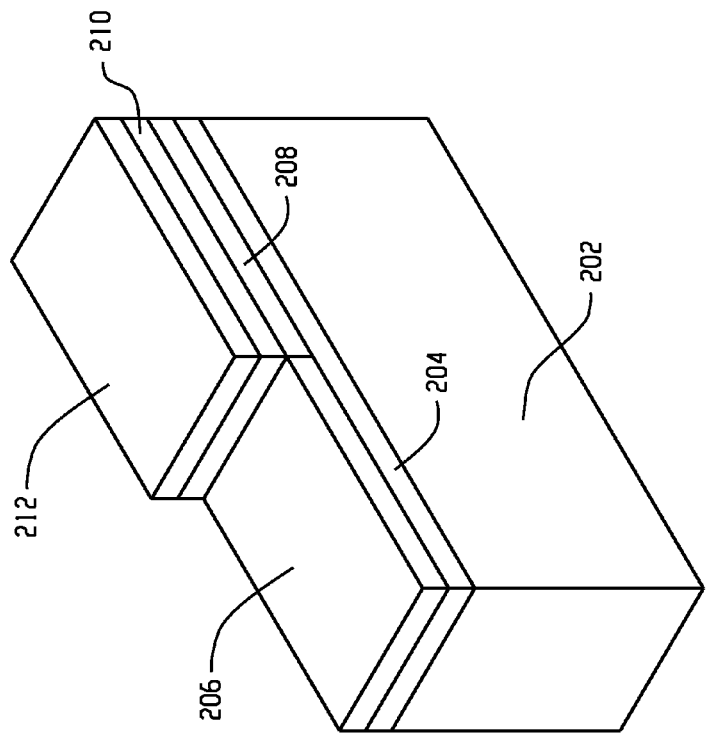

FIG. 9 depicts an isometric view of a portion of the semiconductor structure after the second channel material 212 and buried oxide layer 210 have been removed from the NMOS region of the semiconductor structure (operation 116 of FIG. 3).

Figure 10:
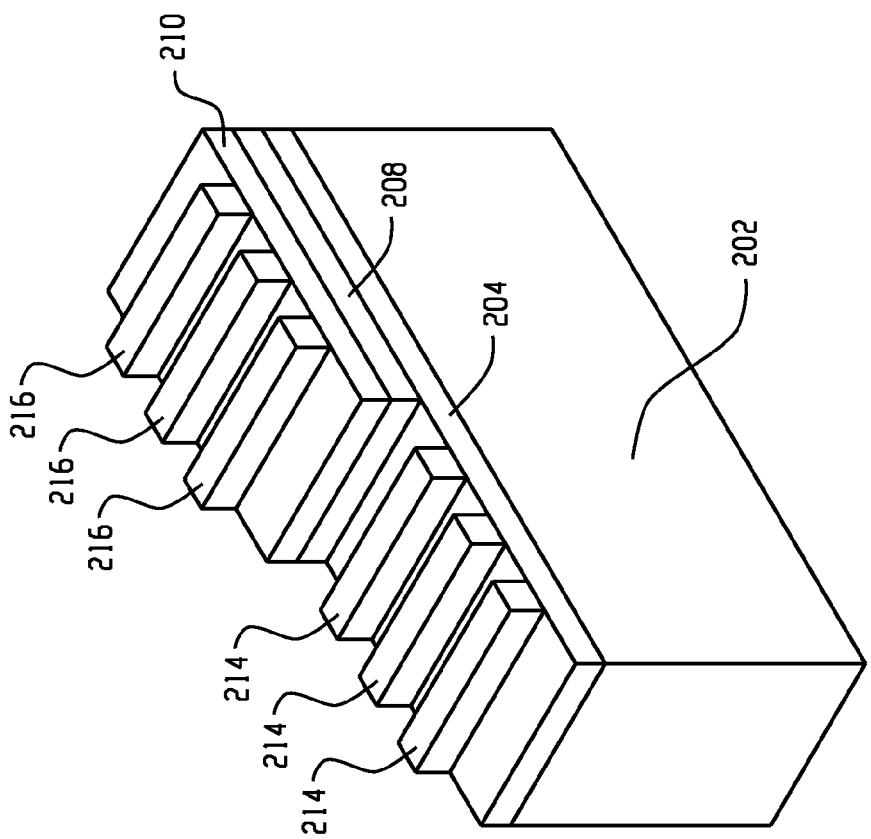

FIG. 10 depicts an isometric view of a portion of the semiconductor structure after OD definition (operation 120 of FIG. 3). Shown are OD fins 214 for the NMOS transistor and OD fins 216 for the PMOS transistor. The OD fins 214 for the NMOS transistor comprise Si with P-well implantation and the OD fins 216 for the PMOS transistor comprise SiGe with N-well implantation.

Figure 11B:
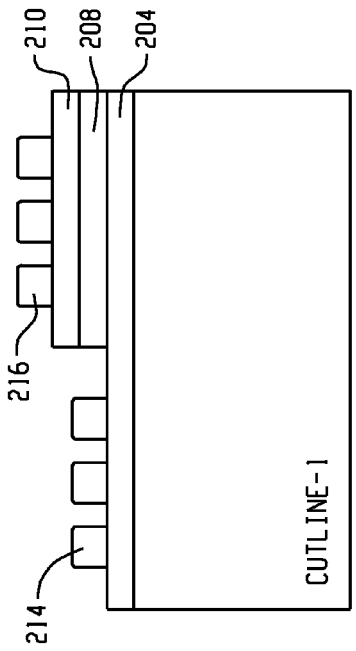
Figure 11C:
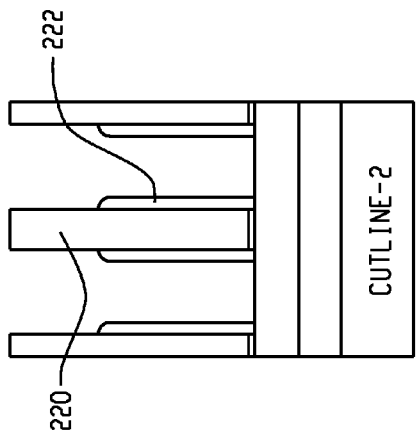
Figure 11A:
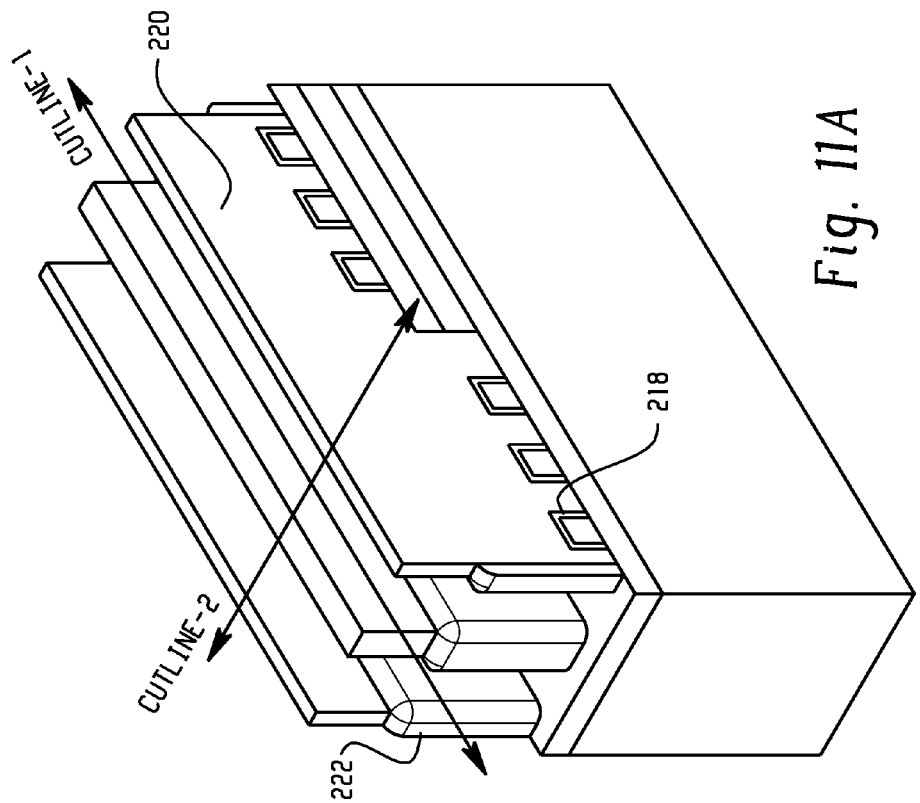

FIG. 11A depicts an isometric view of a portion of the semiconductor structure after interfacial layer/High-K dielectric ("IL/HK") 218, gate 220 and Nitride spacer 222 formation (operations 122 and 124 of FIG. 3). The gate 220 may comprise Al, Cu, W, or poly-Si. The IL/HK 218 may comprise $Al_2O_3$, $SiO_2$, or $HfO_2$. FIG. 11B provides a cross-sectional view of the semiconductor structure from cutline 1 of FIG. 11A. FIG. 11C provides a cross-sectional view of the semiconductor structure from cutline 2 of FIG. 11A.

Figure 12B:
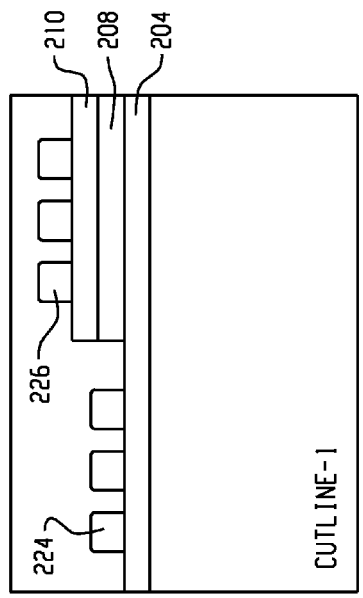
Figure 12C:
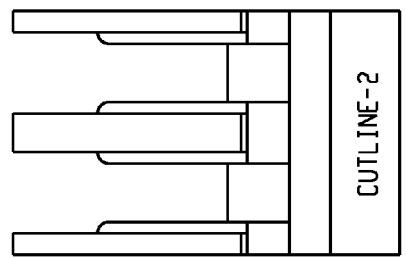
Figure 12A:
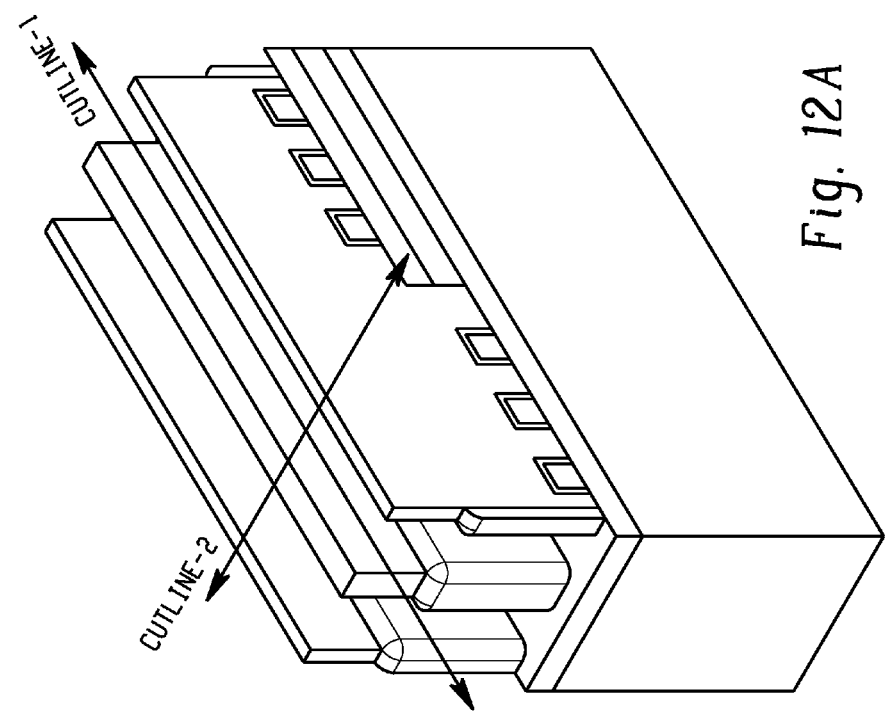

FIG. 12A depicts an isometric view of a portion of the semiconductor structure after source/drain formation (operation 126 of FIG. 3). FIG. 12B provides a cross-sectional view of the semiconductor structure from cutline 1 of FIG. 12A. FIG. 12C provides a cross-sectional view of the semiconductor structure from cutline 2 of FIG. 12A. FIG. 12B shows the source/drain region 224 of the NMOS transistor with epitaxial growth and N+ implantation and the source/drain region 226 of the PMOS transistor with epitaxial growth and P+ implantation. FIG. 12B also illustrates that the thickness of the buried oxide layer 210 and the ILD0 layer 208 are determined by the fin height of the NMOS transistor. The first channel material and the second channel material are at different levels. Therefore, the total height should be minimized to reduce the difficulty of subsequent operations. In this example, the fin height of first transistor is approximately 10 nm~20 nm. The buried/glue/buffer oxide should be as thin as possible (e.g., smaller than 10 nm).

FIG. 13A depicts an isometric view of a portion of the semiconductor structure after ILD0 oxide deposition and ILD0 oxide CMP (operation 128 of FIG. 3). FIG. 13B provides a cross-sectional view of the semiconductor structure from cutline 1 of FIG. 13A. FIGS. 13A and 13B show the deposited ILD0 228.

Figure 14B:
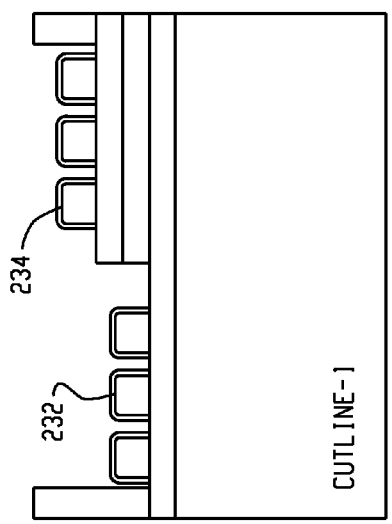
Figure 14C:
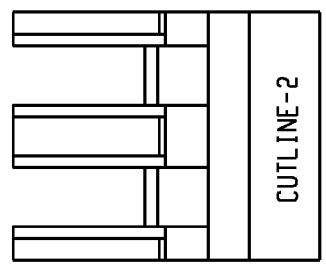
Figure 14A:
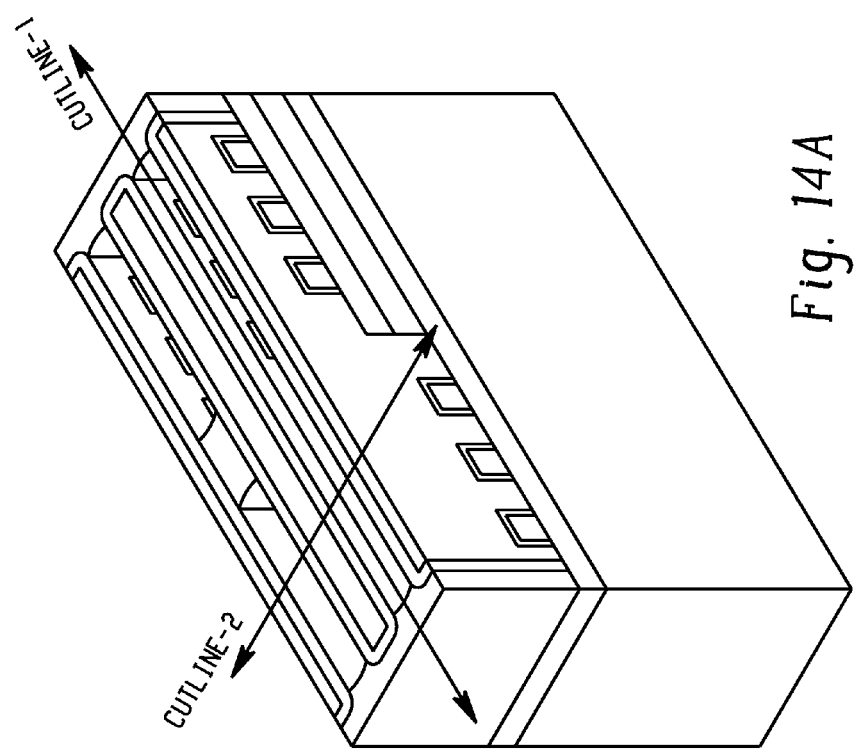
Figure 15B:
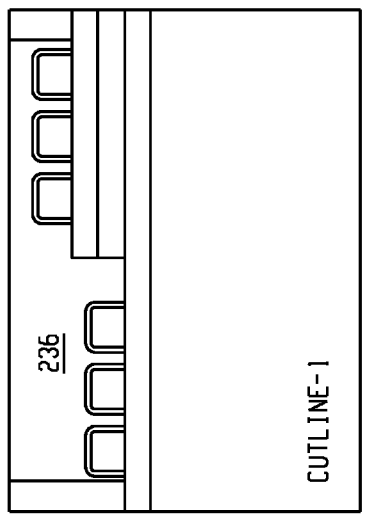
Figure 15C:
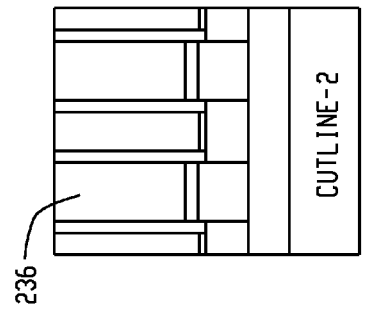
Figure 15A:
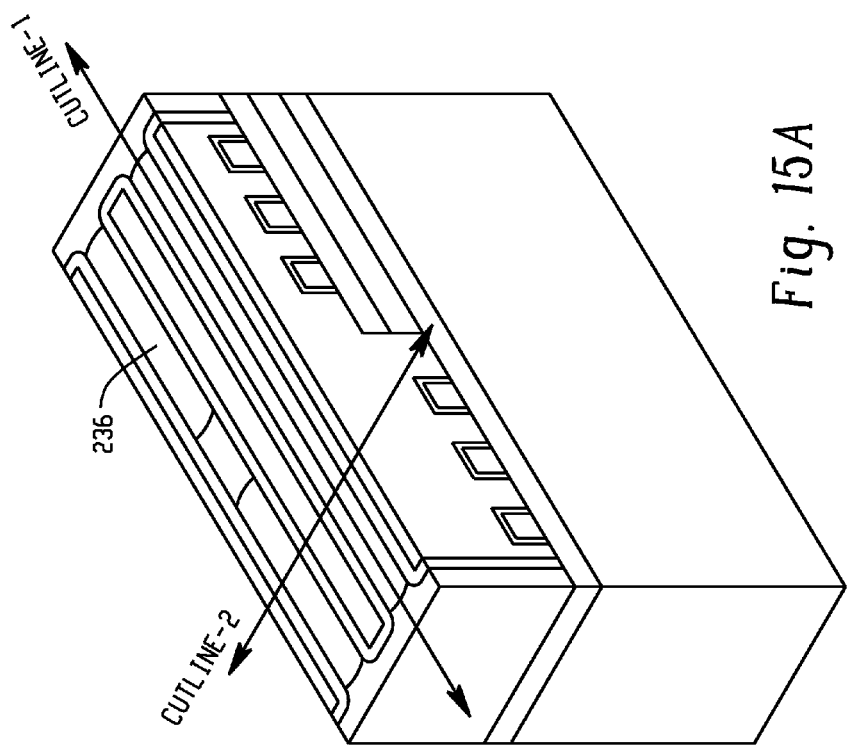

FIG. 14A depicts an isometric view of a portion of the semiconductor structure after M0 patterning and etching using the M0 mask and salicidation (operation 132 of FIG. 3). FIG. 14B provides a cross-sectional view of the semiconductor structure from cutline 1 of FIG. 14A. FIG. 14C provides a cross-sectional view of the semiconductor structure from cutline 2 of FIG. 14A. FIG. 14B shows the silicide 232 and silicide 234 in the NMOS and PMOS transistors, respectively. The silicide 232 may comprise NiSi and the silicide 234 may comprise NiSiGe. The dielectric material used for the glue/buffer layer should be selected to have a good selective etching ratio relative to ILD0 oxide (e.g., denser SiO2, nitride-base material or other oxide material) to prevent too much loss when etching ILD0 oxide FIG. 15A depicts an isometric view of a portion of the semiconductor structure after M0 deposition and planarizing (operation 134 of FIG. 3). FIG. 15B provides a cross-sectional view of the semiconductor structure from cutline 1 of FIG. 15A. FIG. 15C provides a cross-sectional view of the semiconductor structure from cutline 2 of FIG. 15A. FIGS. 15A-C show the deposited M0 236. The M0 may be formed using materials such as W or Cu.

FIG. 16A depicts an isometric view of a portion of the semiconductor structure after BEOL operations (operation 136 of FIG. 3). FIG. 16B provides a cross-sectional view of the semiconductor structure from cutline 1 of FIG. 16A. FIG. 16C provides a cross-sectional view of the semiconductor structure from cutline 2 of FIG. 16A. FIGS. 16A-C show the Vss metal contact 240, VDD metal contact 242, output metal contact 244, input metal contact 246, via 247, and interlayer dielectric oxide ("ILD1") material 248.

FIGS. 17A-2C are additional block diagrams of example masks that may be used to fabricate the example inverter circuit 10 depicted in FIG. 1. FIG. 17A depicts an example mask that can be used for the structure related layers. FIG. 17A is similar to FIG. 2A but shows additional cutlines. FIG. 17B depicts an example mask that can be used for the BEOL related layers and is the same as FIG. 2B. FIG. 17C depicts an example mask that can be used for the implantation related layers and is the same as FIG. 2C. In particular, the OD mask portions are depicted at 12, the Gate mask portions are depicted at 14, the M0 mask portions are depicted at 16, the Via0 mask portions are depicted at 18, the M1 mask portions are depicted at 20, the P-Well implantation mask portions are depicted at 22, the N-Well implantation mask portions are depicted at 24, the P+ implantation mask portions are depicted at 26, and the N+ implantation mask portions are depicted at 28. The layout/design and masks provided in FIGS. 17A-17C may be used for fabricating a semiconductor structure wherein all of the transistors are fabricated on a single transistor layer and also may be used for fabricating a semiconductor structure having multiple transistor layers.

Figure 18:
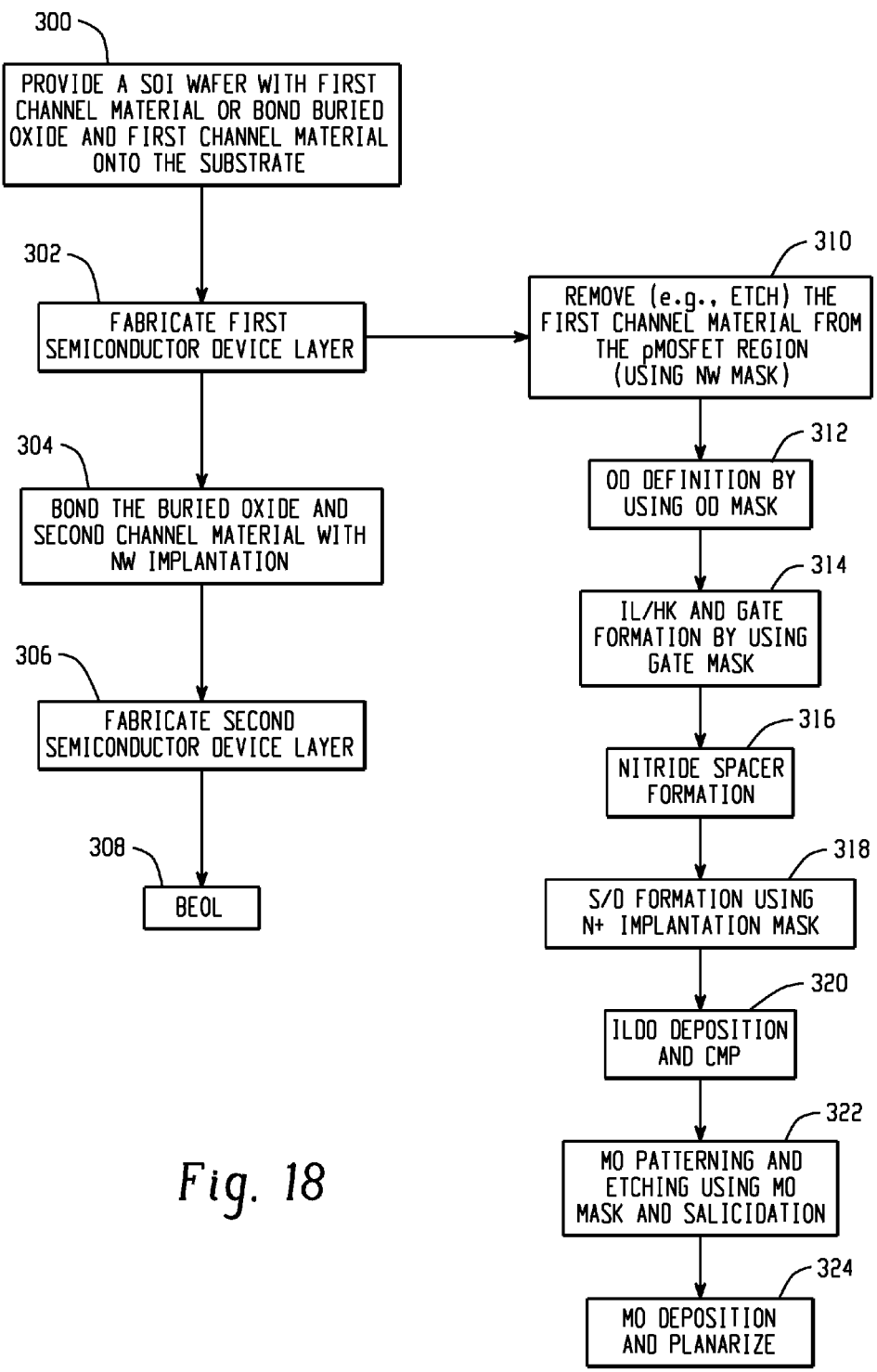
FIGS. 18-20 are process flow charts depicting example methods for generating a multilayer semiconductor device structure.

FIG. 18 is a process flow chart depicting additional example methods for generating the example inverter in a multilayer semiconductor device structure. Because the example converter comprises a PMOS transistor and a NMOS transistor, the NMOS transistor in this example is fabricated using a first channel material on a first transistor level and the PMOS transistor is fabricated using a second channel material on a second transistor level. Alternatively, the PMOS transistor can be fabricated using a first channel material on a first transistor level and the NMOS transistor can be fabricated using a second channel material on a second transistor level.

Figure 21:
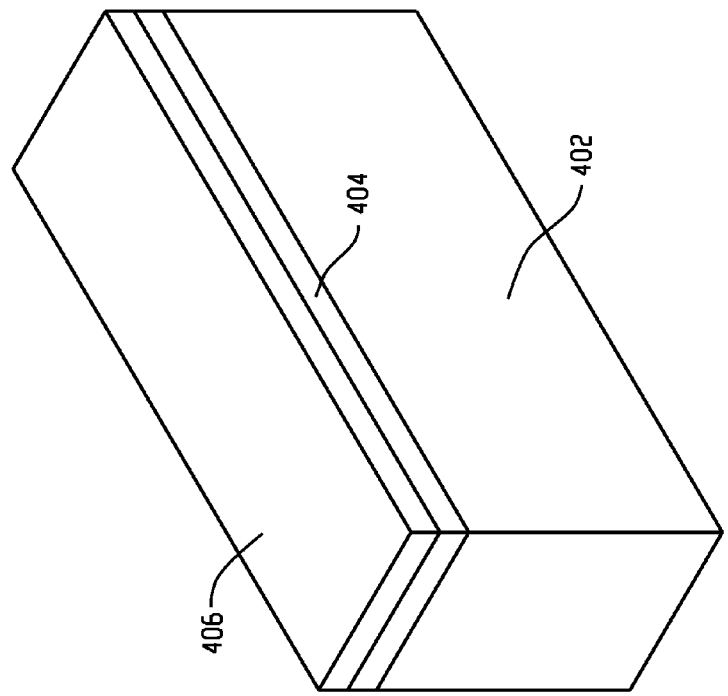

At operation 300, a first semiconductor-on-insulator ("SOI") wafer with the first channel material is provided for the first layer. Alternatively, at operation 300, a substrate with bonded bond buried oxide and the first channel material may be provided. FIG. 21 depicts an isometric view of a portion of an example SOI wafer that may be provided in connection with operation 300. A wafer comprising a substrate 402, a buried oxide layer 404 and first channel material 406 above the buried oxide layer 404 is depicted. The first channel material 406, in this example, comprises Silicon with a P-well implantation.

Referring back to FIG. 18, at operation 302, the NMOS transistor on the first transistor level is fabricated. The first transistor layer may be fabricated using suitable processes including photolithography, etching, cleaning, chemical mechanical polishing/planarization ("CMP"), thin film deposition, thermal process (e.g., doping, activation/surface, passivation/material consolidation), epitaxy, and material filling, among others. For example, the photolithography process may include forming a photoresist layer ("resist"), exposing the resist to a pattern, performing post-exposure bake processes, and developing the resist to form a masking element. The masking element may then be used in an etching process. The etching may be performed using reactive ion etch ("RIE") and/or other suitable processes. As discussed in more detail below, the fabrication of the first transistor on this level involves the removal of the first channel material from the PMOS region of the semiconductor device structure so that the NMOS transistor is fabricated with the first channel material and the PMOS transistor may be fabricated with a second channel material.

Next, a second semiconductor on insulator ("SOI") wafer is bonded onto the surface of the first wafer (operation 304). The SOI substrate in this example comprises a buried oxide layer and a second channel material with N-well implantation. The bottom surface of the insulator of the SOI substrate is bonded to the top surface of the first semiconductor layer using a layer of glue. In some embodiments, the bonding surface of the insulator and patterned surface of the first semiconductor layer are processed to clean, remove excess particles, and make the surfaces hydrophobic or hydrophilic. After the surfaces are processed, the wafer containing the first semiconductor layer and the wafer containing the SOI substrate are aligned. After alignment the layers can be bonded through a touch and press process. The Van der Waals force will link the atoms of the interface between the bottom of the second semiconductor layer and the top of the first semiconductor layer together (this process may involve some plasma enhancement technique). Also a thermal annealing procedure can be applied to enhance the linking of atoms at the interface. The resultant semiconductor structure can have a planarization process or CMP process applied to reduce the thickness of second semiconductor layer to the required thickness.

The second semiconductor substrate has a semiconductor on insulator ("SOI") structure comprising a buried oxide and a second channel material. The buried oxide functions as an electrical insulator underneath the semiconductor channel material. The buried oxide may be formed from material such as $SiO_2$, HfO, $Al_2O_3$ or other suitable oxide material. The electrical insulator functions to insulate the second channel material in the second semiconductor substrate from the devices formed on the first semiconductor device layer.

The second channel material may be formed from material such as Si, SiGe, GaAs, or others. The second channel material in this example is different from the semiconductor channel material used in the first semiconductor device layer.

Next, the transistor on the second transistor level is fabricated (operation 306). The second transistor layer may be fabricated using suitable processes including photolithography, etching, cleaning, chemical mechanical polishing/planarization ("CMP"), thin film deposition, thermal process (e.g., doping, activation/surface, passivation/material consolidation), epitaxy, and material filling, among others. For example, the photolithography process may include forming a photoresist layer ("resist"), exposing the resist to a pattern, performing post-exposure bake processes, and developing the resist to form a masking element. The masking element may then be used in an etching process. The etching may be performed using reactive ion etch ("RIE") and/or other suitable processes. As discussed in more detail below, the fabrication of the second transistor on this level involves the removal of the second channel material from the NMOS region of the semiconductor device structure so that the NMOS transistor is fabricated with the first channel material and the PMOS transistor is fabricated with a second channel material.

After the transistor on the second transistor level is fabricated, back-end-of-line ("BEOL") operations may take place (operation 308), where the individual devices are interconnected with wiring on the multi-layer semiconductor structure. BEOL may include fabrication of contacts, insulating layers (dielectrics), metal levels, and bonding sites for chip-to-package connections.

Figure 22:
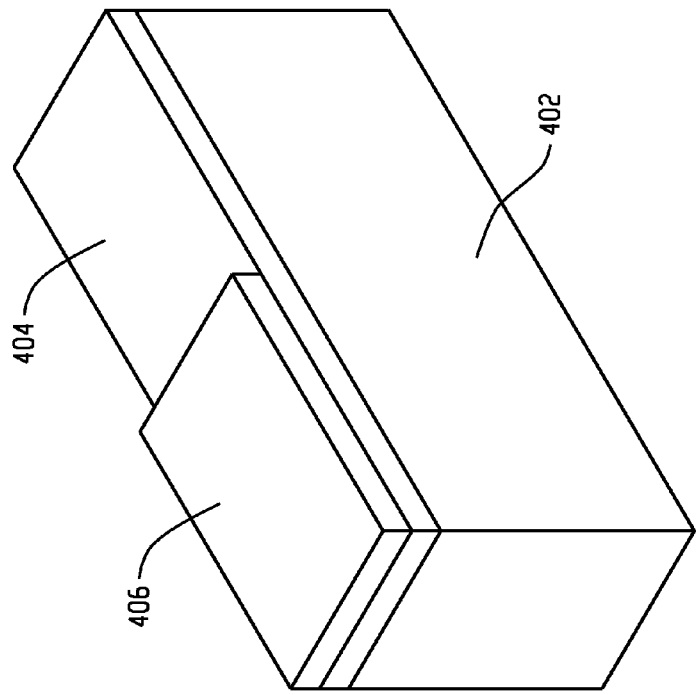

Referring back to operation 302, the fabrication of the first transistor layer comprises removing the first channel material from the PMOS region (operation 310), for example, by an etch process using an N-well mask such as that depicted in FIG. 17C. FIG. 22 depicts an isometric view of a portion of an example SOI wafer in which the first channel material has been removed from the PMOS region. The wafer comprises a substrate 402 with a buried oxide layer 404 that extends across the entire substrate. First channel material 406 has been removed from the PMOS region above the buried oxide layer 402 and only exists in the NMOS region identified in the mask of FIG. 17C.

Figure 23:
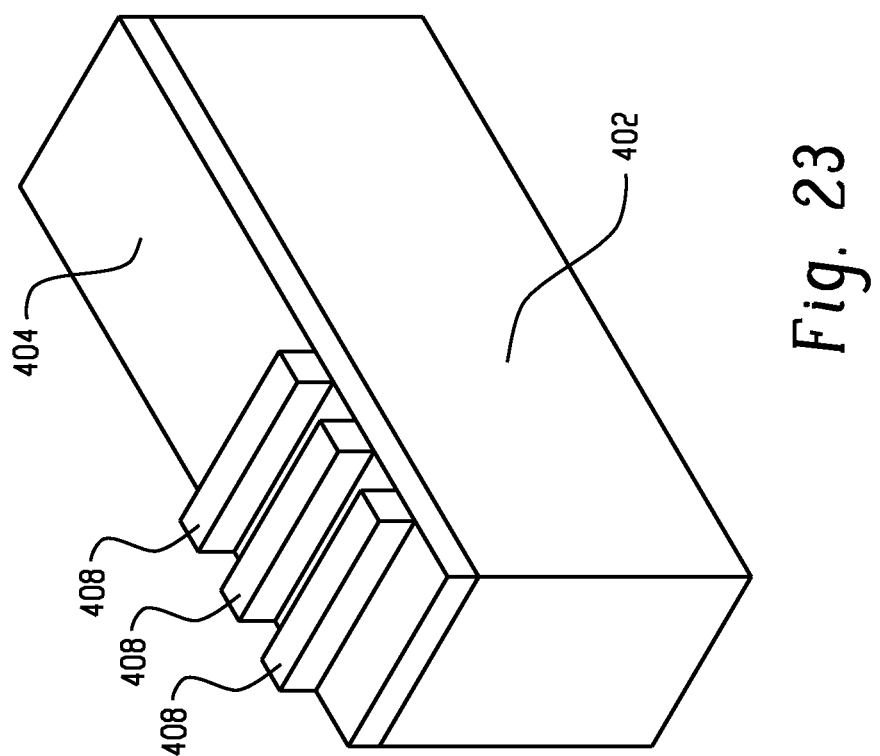

Referring back to FIG. 18, at operation 312, fabrication continues in the NMOS region with OD definition by using the OD mask to begin the formation of OD fins for the NMOS transistor. FIG. 23 depicts an isometric view of a portion of the example SOI wafer wherein OD fins 408 for the NMOS transistor have been formed using the first channel material 406. The OD fins are formed in the NMOS region identified in the mask of FIG. 17C.

Figure 24B:
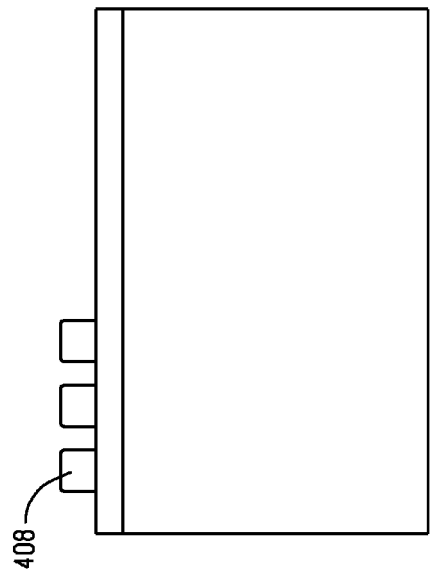
Figure 24A:
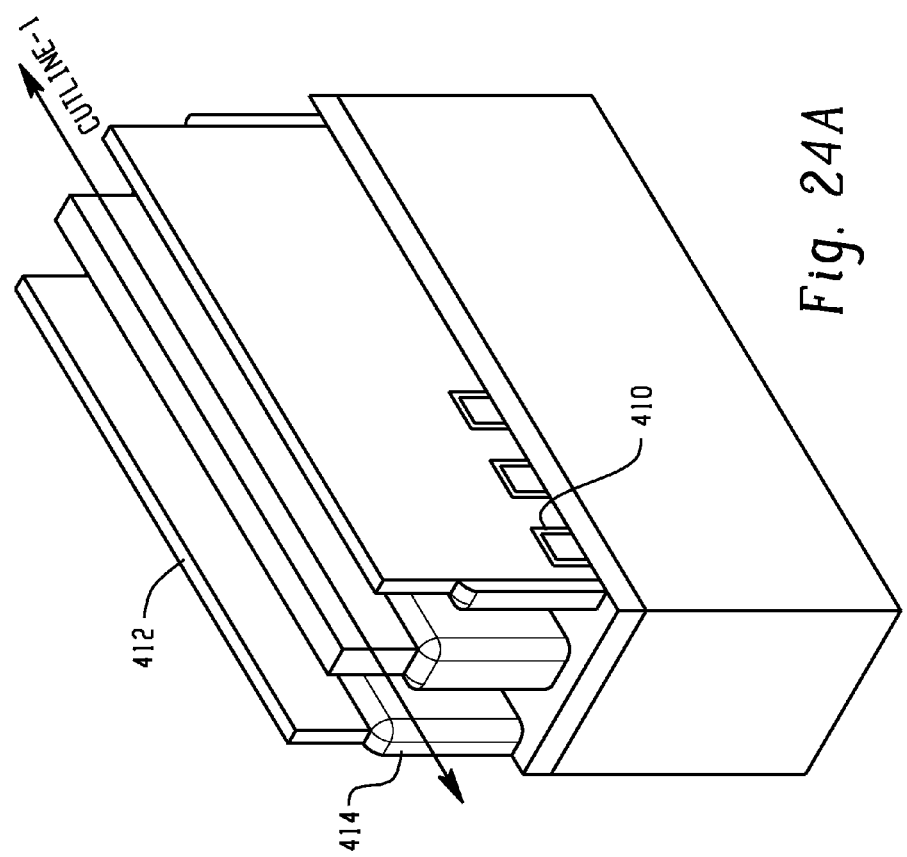

Referring back to FIG. 18, at operation 314, the first transistor level fabrication also comprises interfacial layer/High-K dielectric ("IL/HK") and gate formation using the gate mask (operation 314) and nitride spacer formation (operation 316). FIG. 24A depicts an isometric view of a portion of the example semiconductor structure after interfacial layer/High-K dielectric ("IL/HK") 410, gate 412, and nitride spacer 414 formation. The IL/HK 410 may comprise material such as $Al_2O_3$, $SiO_2$, and $HfO_2$. The gate 412 may comprise material such as Al, Cu, W, and poly-silicon. FIG. 24B provides a cross-sectional view of the semiconductor structure from cutline 1 of FIG. 24A.

Figure 25B:
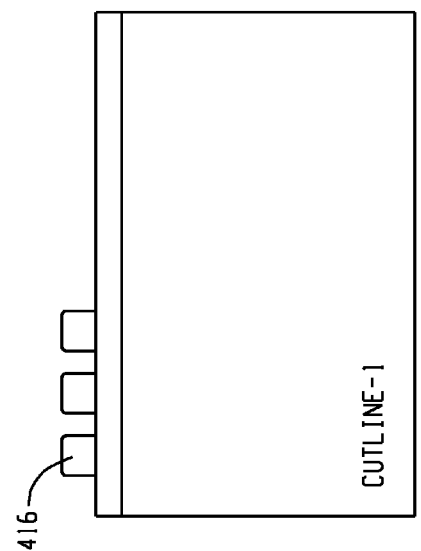
Figure 25A:
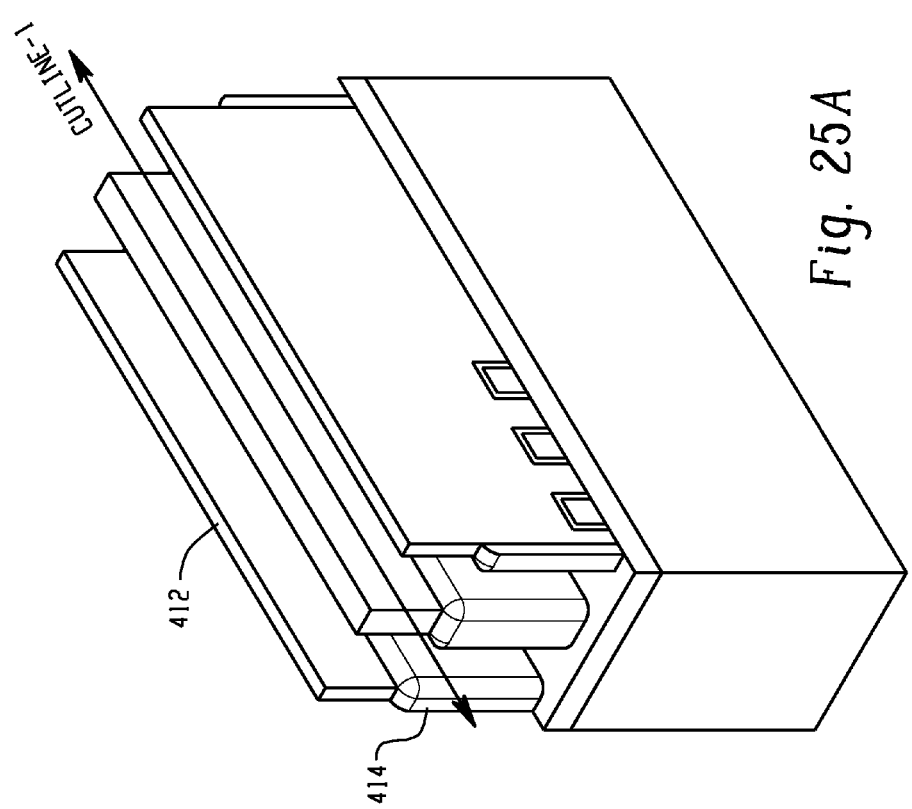

Referring back to FIG. 18, at operation 318, the first transistor level fabrication also comprises source/drain formation using an N+ implantation mask. FIGS. 25A and 25B depict source/drain 416 after formation. The formation of the source/drain region 416 comprises epitaxial growth with N+ implantation. FIG. 25B provides a cross-sectional view of the semiconductor structure from cutline 1 of FIG. 25A.

Figure 26B:
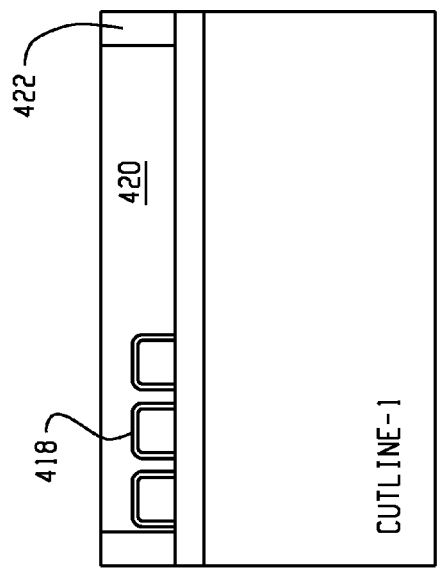
Figure 26A:
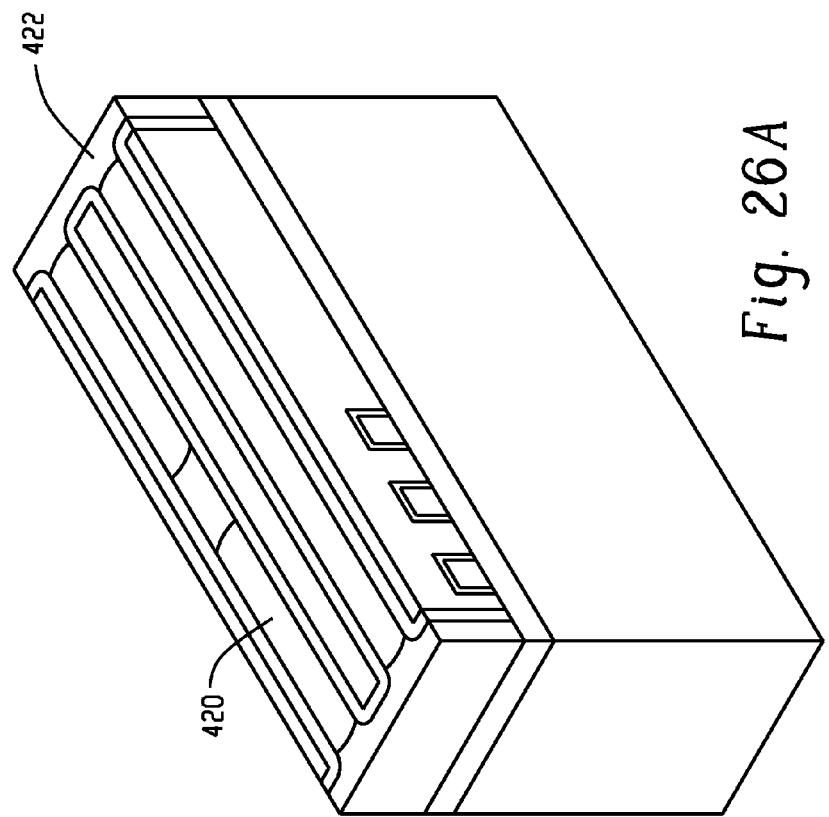

Referring back to FIG. 18, the first transistor level fabrication also comprises ILD0 oxide deposition and ILD0 oxide CMP (operation 320), M0 patterning and etching using the M0 mask and salicidation (operation 322), and M0 deposition and planarizing (operation 324). FIGS. 26A and 26B depict the semiconductor structure after ILD0 oxide deposition and ILD0 oxide CMP, M0 patterning and etching using the M0 mask and salicidation, and M0 deposition and planarizing operations are completed and show the applied M0 420 and deposited ILD0 422. FIG. 26B provides a cross-sectional view of the semiconductor structure from cutline 1 of FIG. 26A and illustrates the applied M0 420, the deposited ILD0 422, and the silicide 418 in the source/drain region.

Figure 19:
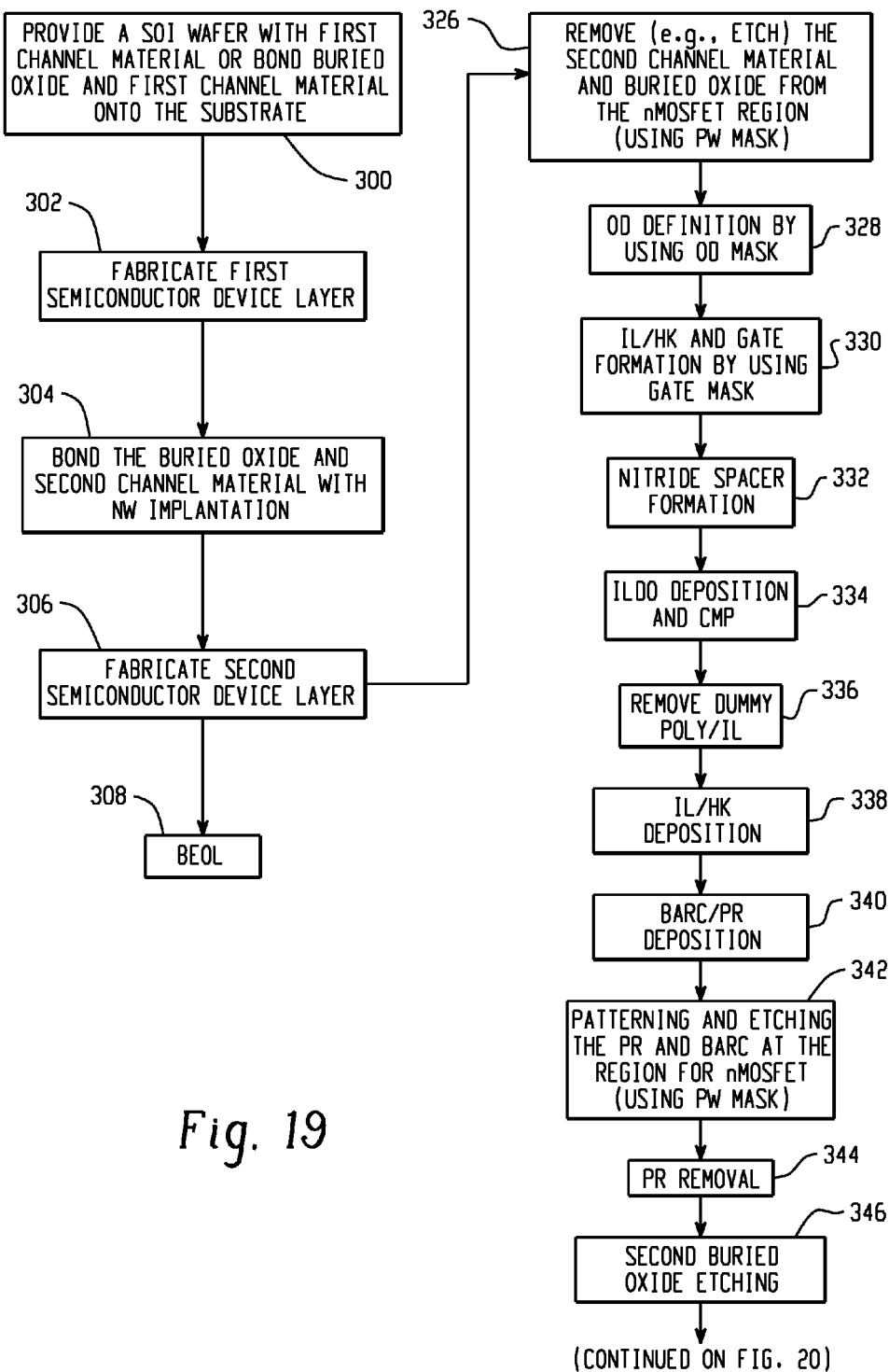
Figure 27:
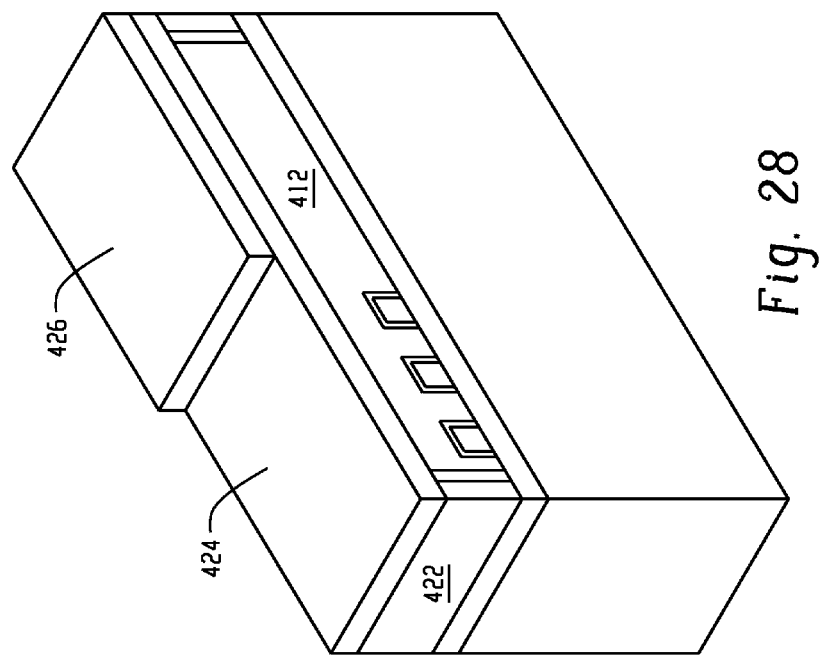
Figure 28:
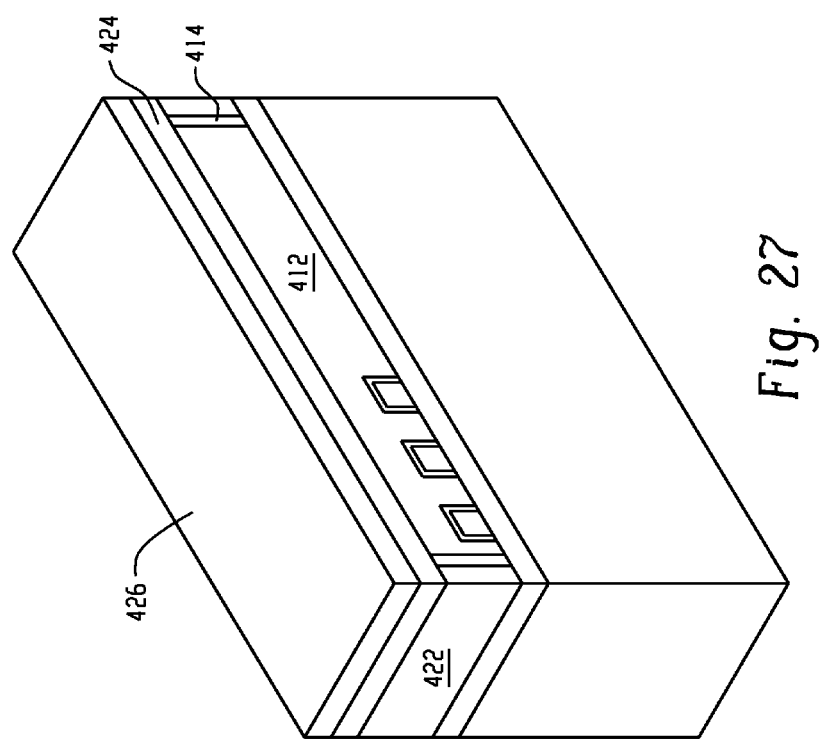

After the first transistor level fabrication has been completed, the semiconductor structure comprises an NMOS transistor in the NMOS region and a dummy gate in the PMOS region. The semiconductor structure is now ready for the bonding of a second wafer on the surface of the semiconductor structure so that the PMOS transistor can be fabricated with second channel material on a second transistor level. FIG. 27 depicts an isometric view of the semiconductor structure after the bonding of a second wafer on the surface of the first layer. Shown is a buried oxide layer 424 that is bonded to the top surface of the first transistor level and second channel material 426 over the buried oxide layer 424. The second channel material may comprise SiGe with N-well implantation. The buried oxide may comprise $Al_2O_3$ or $HfO_2$ FIG. 19 is a process flow chart depicting additional example methods for generating the example inverter in a multilayer semiconductor device structure. In particular, operations that may be involved in the fabrication of the second transistor level are provided. In particular, second transistor level fabrication comprises removing the second channel material from the NMOS region (operation 326). The removal can be accomplished, for example, by an etch process using the P-well mask such as that depicted in FIG. 17C. FIG. 28 depicts an isometric view of the semiconductor structure after operations such as etching to remove the second channel material 426 from the NMOS region have been performed. Shown is the semiconductor structure with the buried oxide 424 and second channel material 426 in the PMOS region and the buried oxide 424 without the second channel material 426 in the NMOS region.

Figure 29:
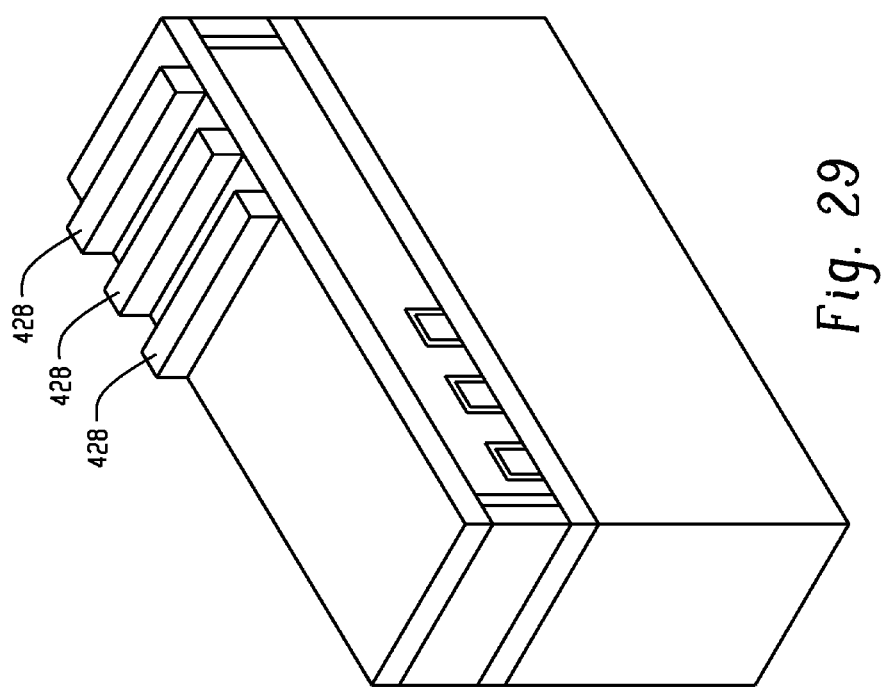

Referring back to FIG. 19, the second level transistor fabrication further comprises OD definition by using the OD mask in the PMOS region (operation 328). FIG. 29 depicts an isometric view of a portion of the semiconductor structure after OD definition. Shown are OD fins 428 for the PMOS transistor and OD fins 416 for the NMOS transistor. The OD fins 428 for the PMOS transistor comprises SiGe with N-well implantation.

Referring back to FIG. 19, the second transistor level fabrication also comprises interfacial layer/High-K dielectric ("IL/HK") and gate formation using the gate mask (operation 330), nitride spacer formation (operation 332), and ILD0 oxide deposition and CMP (operation 334). FIG. 30A depicts an isometric view of a portion of the semiconductor structure after IL/HK and gate formation operations, nitride spacer formation operations, and ILD0 oxide deposition and CMP operations. Shown are the second layer ILD0 430, the second layer nitride spacer 432, dummy poly 434, and dummy interfacial layer ("IL") 436. FIG. 30B provides a cross-sectional view of the semiconductor structure from cutline 3 of FIG. 30A. The thickness $T_2$ of 2nd dummy gate 434 after planarization is much higher than the final thickness $T_1$ of the first gate. The total needed thickness is approximately equal to the final thickness of second gate plus the ILD0 loss when etching buried oxide to connect the first and second gate plus the ILD0 loss when etching buried oxide to connect the first and second M0.

Figure 31B:
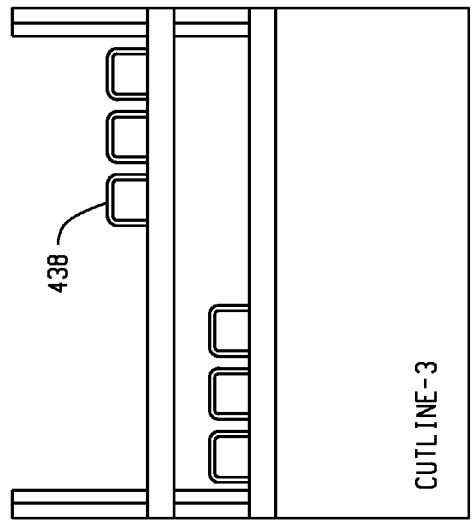
Figure 31A:
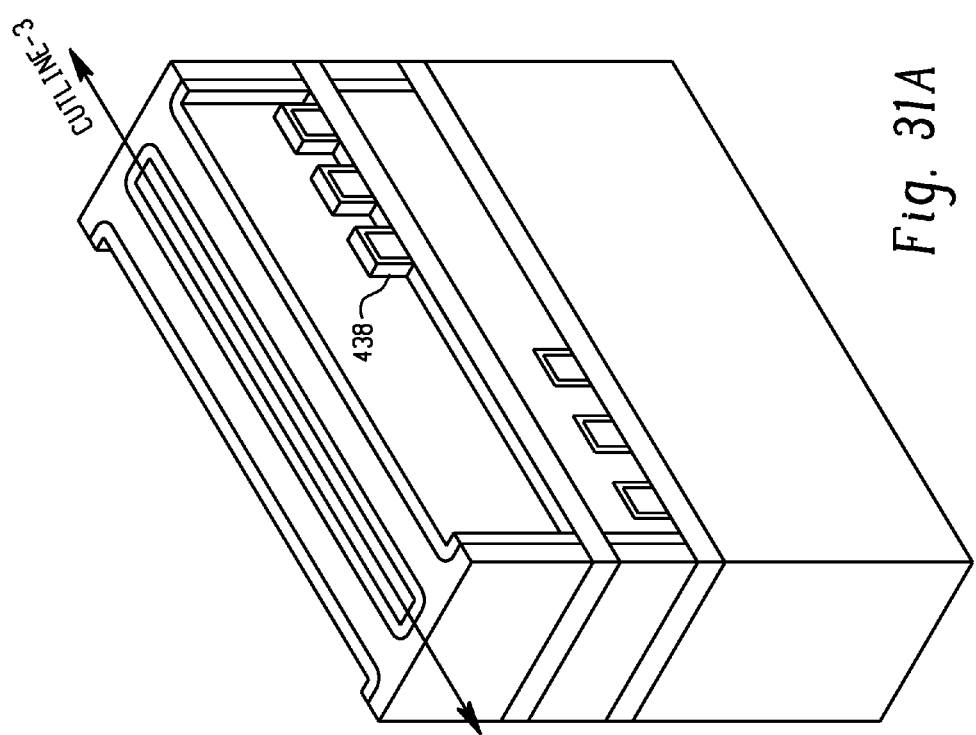

Referring back to FIG. 19, the second level transistor fabrication further comprises removing dummy poly/IL (operation 336) and interfacial layer/High-K dielectric ("IL/HK") deposition (operation 338). FIG. 31A depicts an isometric view of a portion of the semiconductor structure after dummy poly/IL removal and IL/HK deposition. FIG. 31B provides a cross-sectional view of the semiconductor structure from cutline 3 of FIG. 31A. FIGS. 31A-B show IL/HK 438. The IL/HK 438 may comprise material such as $Al_2O_3$, $SiO_2$, and HfO2.

Figure 32B:
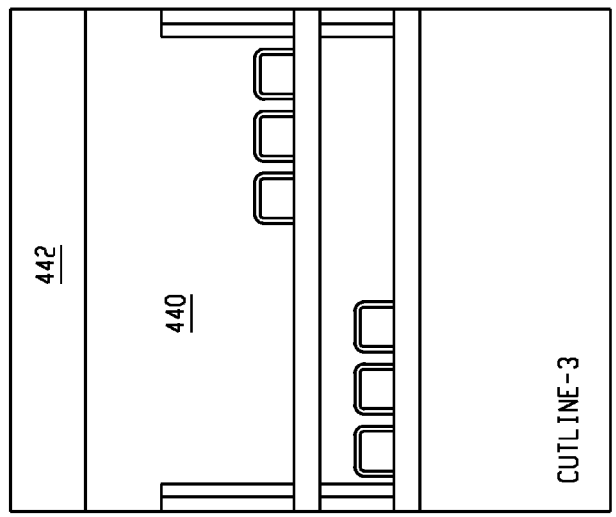
Figure 32A:
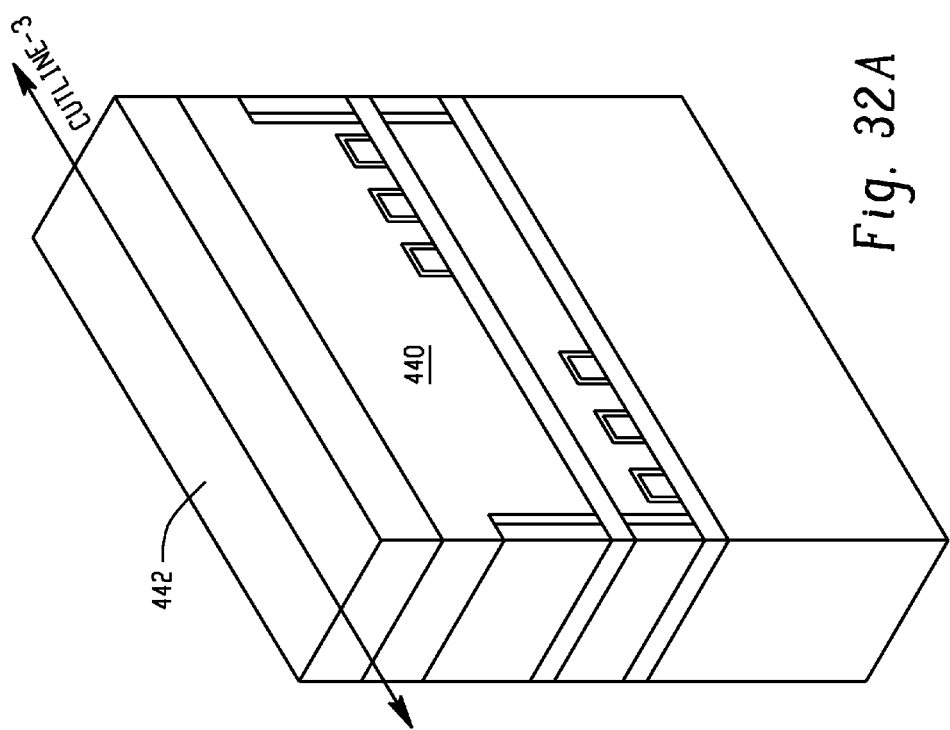

Referring back to FIG. 19, the second level transistor fabrication further comprises back anti-reflection coating/photo resist ("BARC/PR") deposition (operation 340). FIG. 32A depicts an isometric view of a portion of the semiconductor structure after BARC/PR deposition. FIG. 32B provides a cross-sectional view of the semiconductor structure from cutline 3 of FIG. 32A. FIGS. 32A-B show deposited BARC 440 and photo resist 442. Although BARC is used in this example, the BARC may be replaced by several lithography-related layers or other material used for a hard mask. Buffer layers such as pad oxide/nitride may also be deposited before depositing BARC.

Figure 33B:
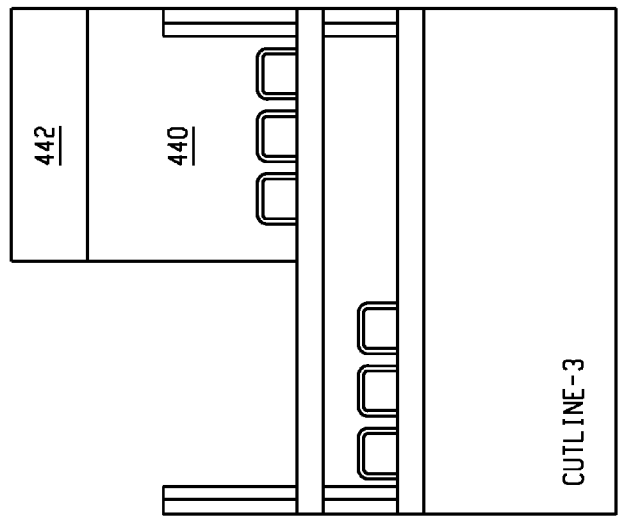
Figure 33A:
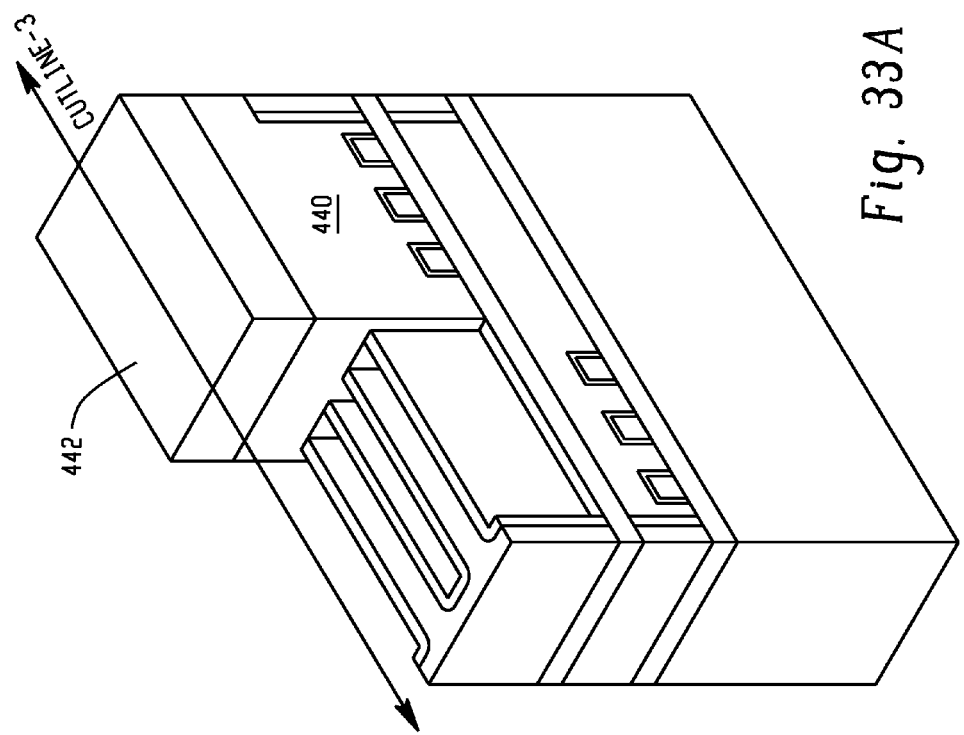

Referring back to FIG. 19, the second level transistor fabrication further comprises patterning and etching the photo resist and BARC at the NMOS region using the P-well mask (operation 342). FIG. 33A depicts an isometric view of a portion of the semiconductor structure after patterning and etching the photo resist and BARC at the NMOS region. FIG. 33B provides a cross-sectional view of the semiconductor structure from cutline 3 of FIG. 33A. FIGS. 33A-B show deposited BARC 440 and photo resist 442 in the PMOS region but not in the NMOS region.

Figure 34B:
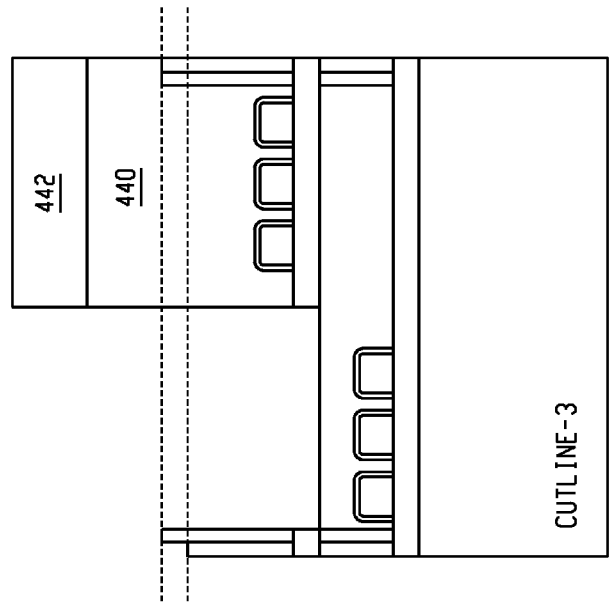
Figure 34A:
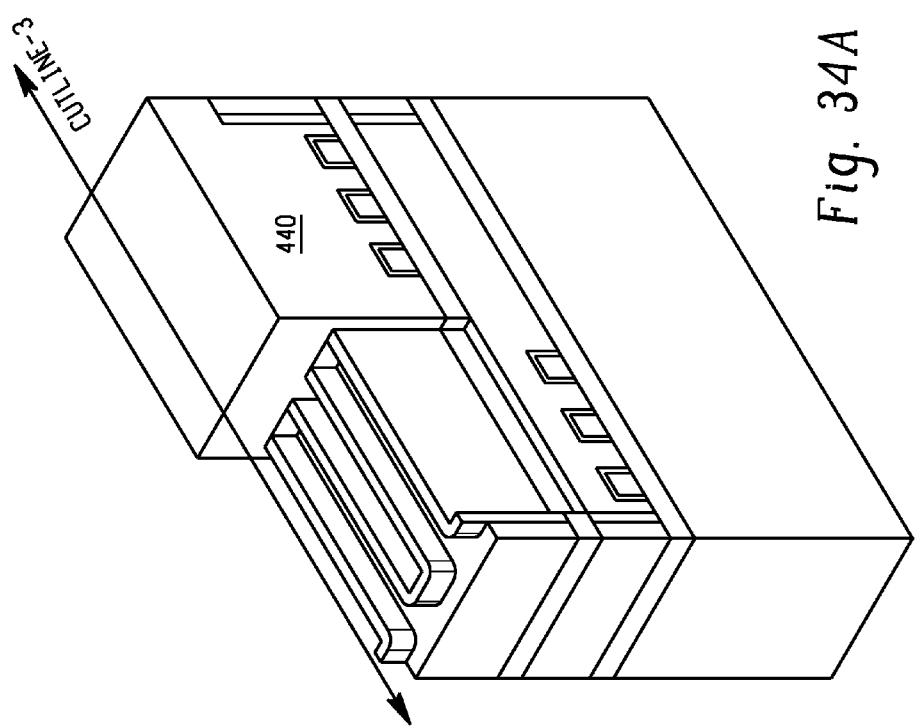

Referring back to FIG. 19, the second level transistor fabrication further comprises photo resist removal (operation 344) and second buried oxide etching (operation 346). FIG. 34A depicts an isometric view of a portion of the semiconductor structure after photo resist removal and second buried oxide etching at the NMOS region. FIG. 34B provides a cross-sectional view of the semiconductor structure from cutline 3 of FIG. 34A. FIGS. 34A-B show removal of second buried oxide in the NMOS region and removal of the photo resist at the PMOS region.

Figure 20:
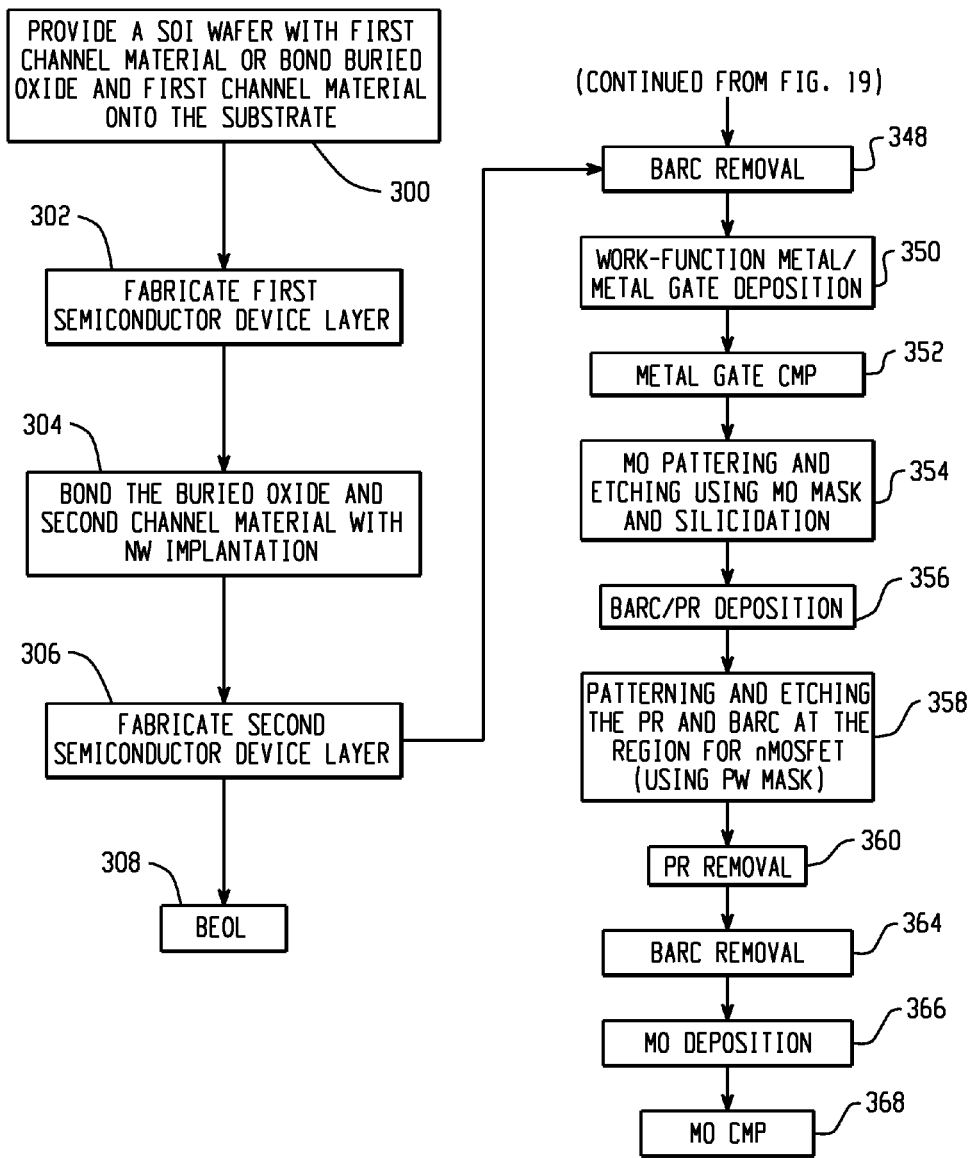

FIG. 20 is a process flow chart depicting additional example methods for generating the example inverter in a multilayer semiconductor device structure. In particular, operations that may be involved in the fabrication of the second transistor level are provided.

Figure 35B:
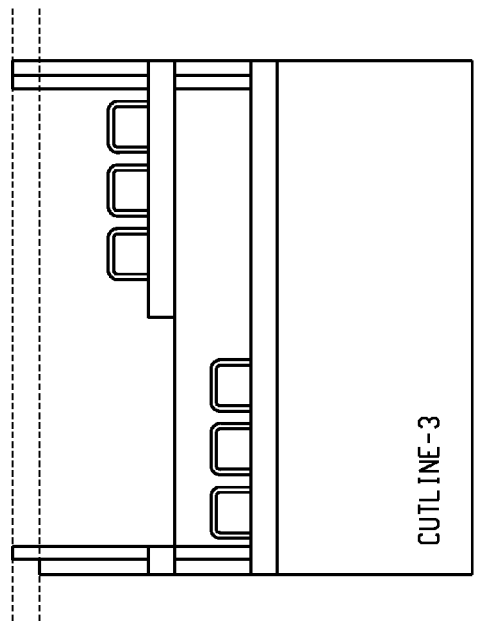
Figure 35A:
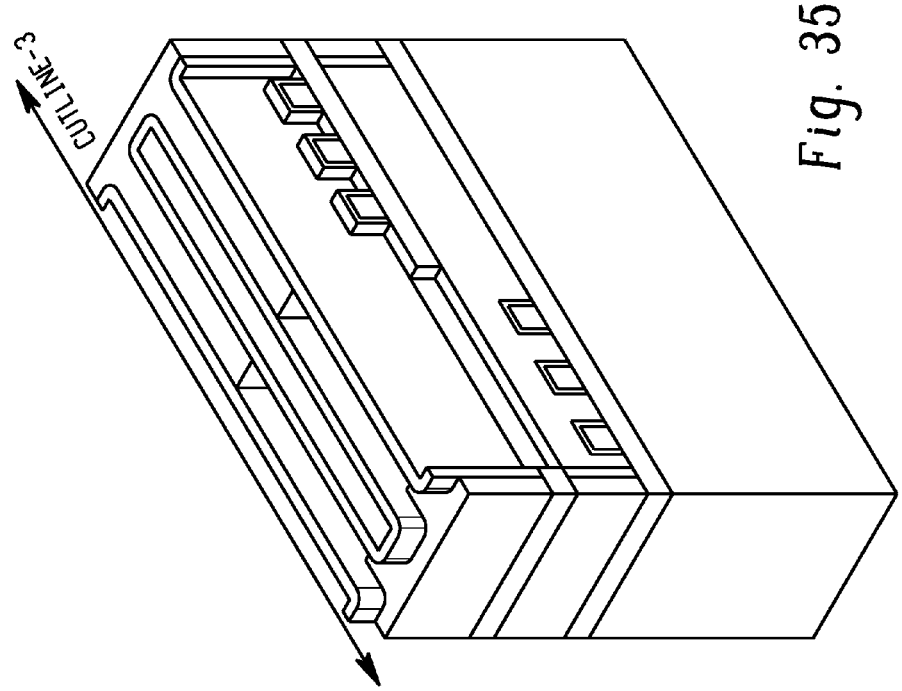

Referring to FIG. 20, the second level transistor fabrication further comprises BARC removal (operation 348). FIG. 35A depicts an isometric view of a portion of the semiconductor structure after BARC removal. FIG. 35B provides a cross-sectional view of the semiconductor structure from cutline 3 of FIG. 35A. The structures depicted in FIGS. 35A-B are similar to the structures depicted in FIGS. 31A-B except that second buried oxide has been removed in the NMOS region and there is a partial loss of the second layer ILD0 in the NMOS region.

Figure 36B:
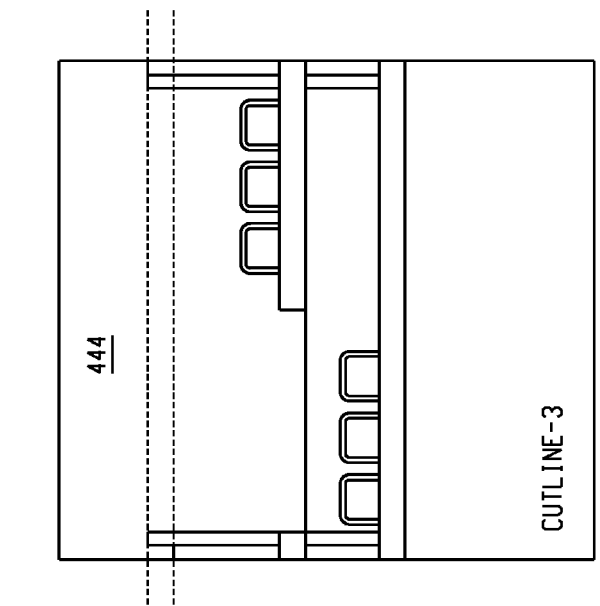
Figure 36A:
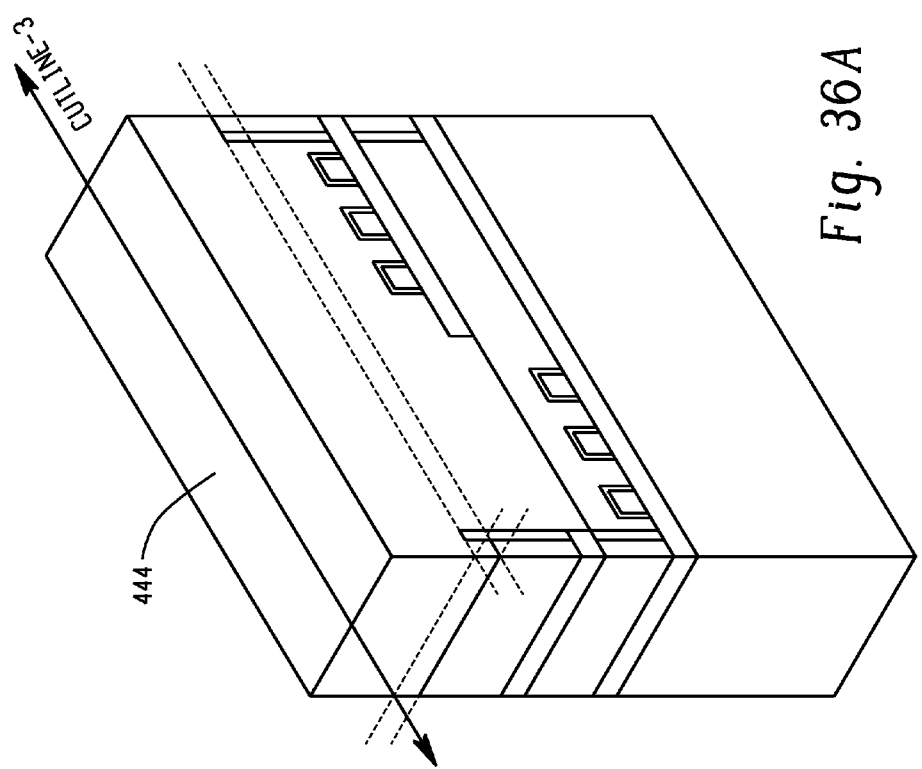

Referring back to FIG. 20, the second level transistor fabrication further comprises work-function metal/metal gate deposition (operation 350). FIG. 36A depicts an isometric view of a portion of the semiconductor structure after work-function metal/metal gate deposition. FIG. 36B provides a cross-sectional view of the semiconductor structure from cutline 3 of FIG. 36A. FIGS. 36A-B show the deposited gate material 444 and that partial gate material 444 may be provided above the ILD0 in the NMOS region. The metal gate material 444 may comprise Al, Cu or W.

Figure 37B:
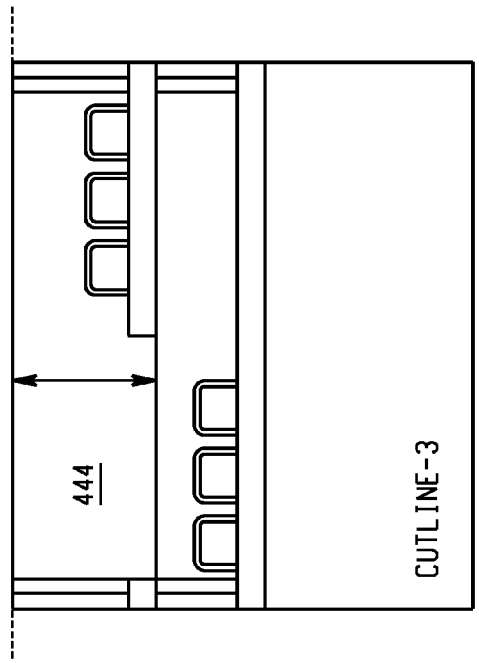
Figure 37A:
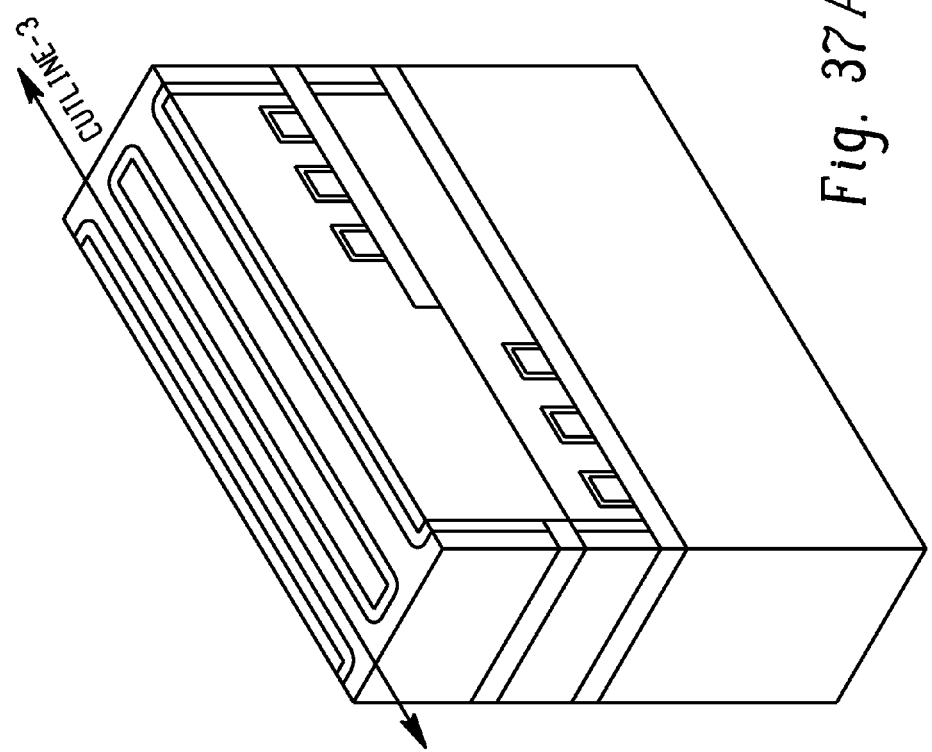

Referring back to FIG. 20, the second level transistor fabrication further comprises metal gate CMP (operation 352). FIG. 37A depicts an isometric view of a portion of the semiconductor structure after metal gate CMP. FIG. 37B provides a cross-sectional view of the semiconductor structure from cutline 3 of FIG. 37A. FIGS. 37A-B show the metal gate 444 level reduced. The second gate CMP involves polishing to remove the gate material above the ILD0 in the NMOS region. This results in the first and second gates having an electrical connection to each other through the opening in the buried oxide.

Figure 38B:
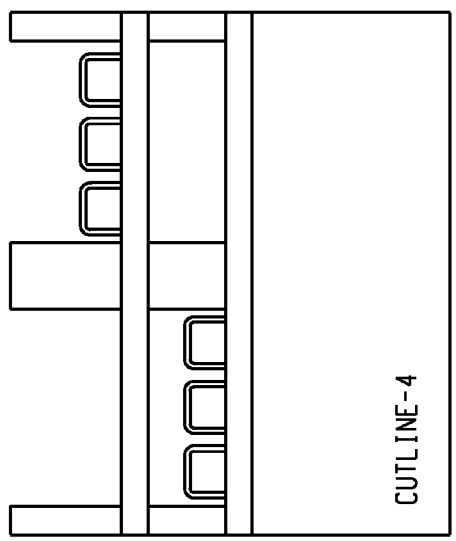
Figure 38A:
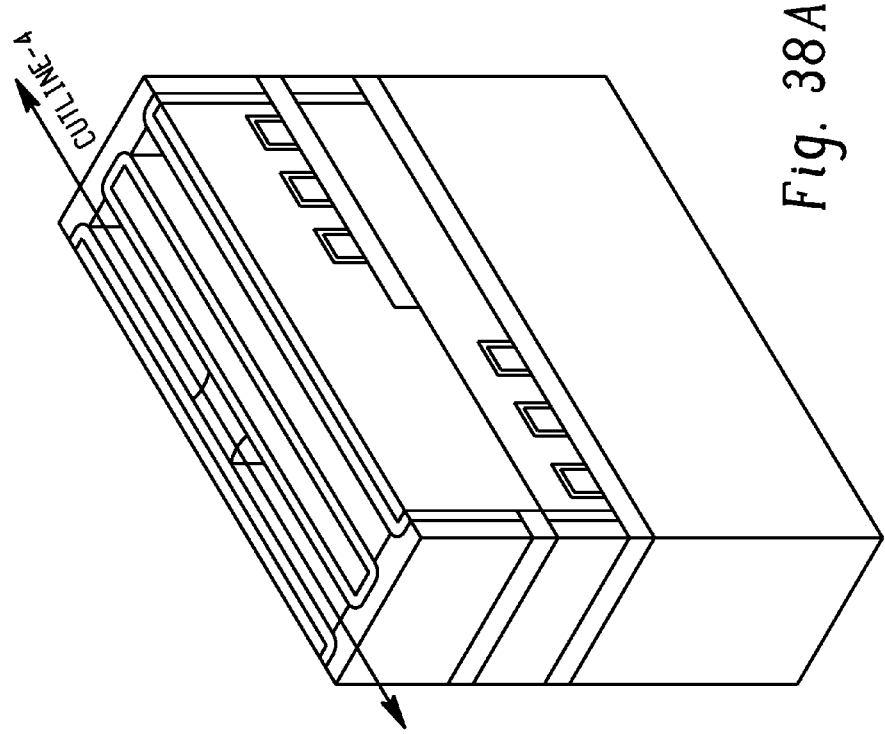

Referring back to FIG. 20, the second level transistor fabrication further comprises M0 patterning and etching using the M0 mask and silicidation (operation 354). FIG. 38A depicts an isometric view of a portion of the semiconductor structure after M0 patterning and etching and silicidation. FIG. 38B provides a cross-sectional view of the semiconductor structure from cutline 4 of FIG. 38A.

Referring back to FIG. 20, the second level transistor fabrication further comprises additional BARC/PR deposition (operation 356). FIG. 39A depicts an isometric view of a portion of the semiconductor structure after BARC/PR deposition. FIG. 39B provides a cross-sectional view of the semiconductor structure from cutline 4 of FIG. 39A. FIGS. 39A-B show deposited BARC 446 and photo resist 448.

Figure 40B:
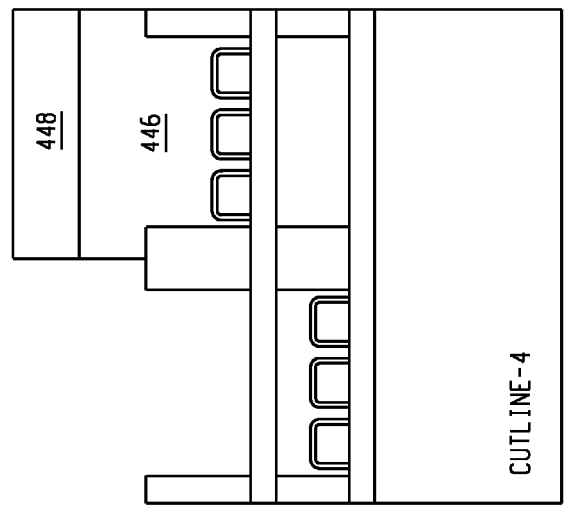
Figure 40A:
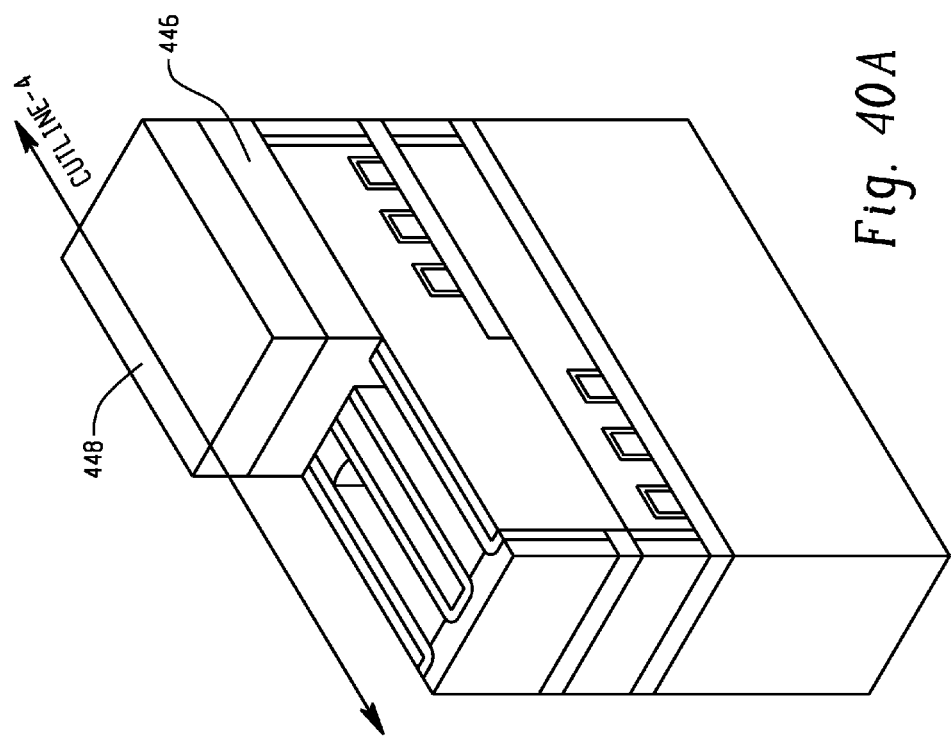

Referring back to FIG. 20, the second level transistor fabrication further comprises patterning and etching the photo resist and BARC at the NMOS region using the P-well mask (operation 358). FIG. 40A depicts an isometric view of a portion of the semiconductor structure after patterning and etching the photo resist and BARC at the NMOS region. FIG. 40B provides a cross-sectional view of the semiconductor structure from cutline 4 of FIG. 40A. FIGS. 40A-B show deposited BARC 446 and photo resist 448 in the PMOS region but not in the NMOS region.

Figure 41B:
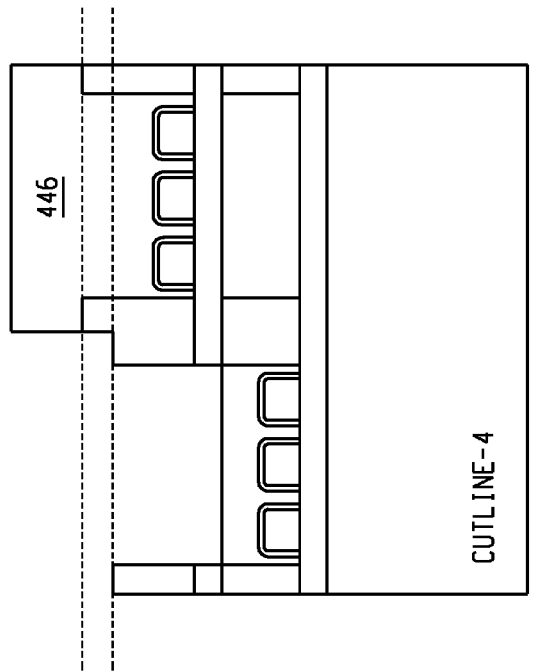
Figure 41A:
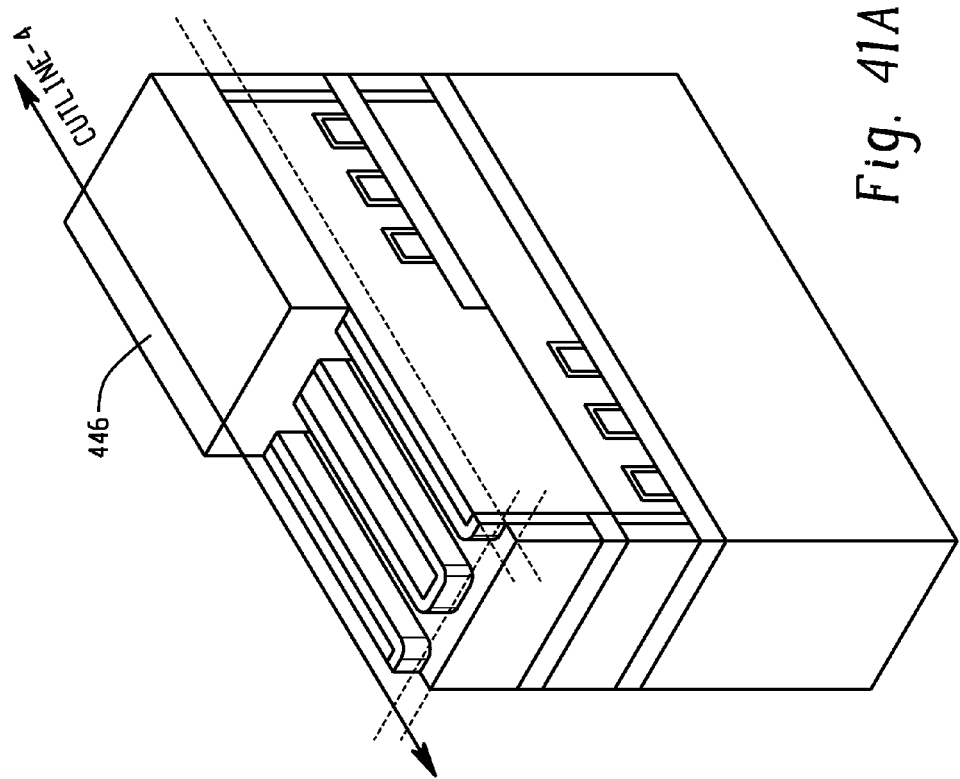

Referring back to FIG. 20, the second level transistor fabrication further comprises photo resist removal (operation 360) and second buried oxide etching (operation 362). FIG. 41A depicts an isometric view of a portion of the semiconductor structure after patterning and etching the photo resist and BARC at the NMOS region. FIG. 41B provides a cross-sectional view of the semiconductor structure from cutline 4 of FIG. 41A. FIGS. 41A-B show additional removal of second buried oxide in the NMOS region, removal of the photo resist at the PMOS region, and partial ILD0 loss.

Figure 42B:
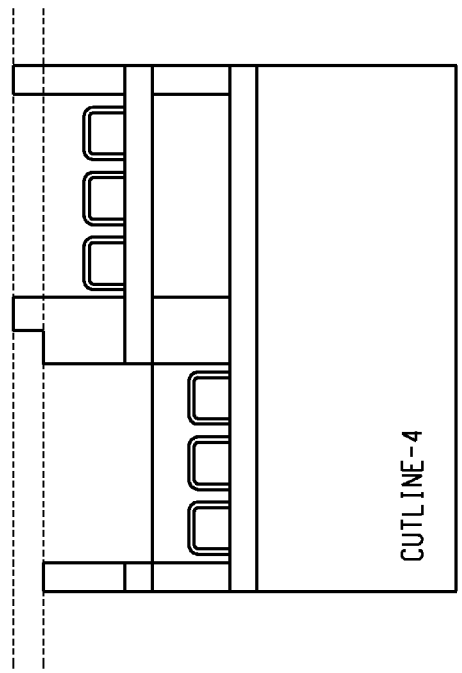
Figure 42A:
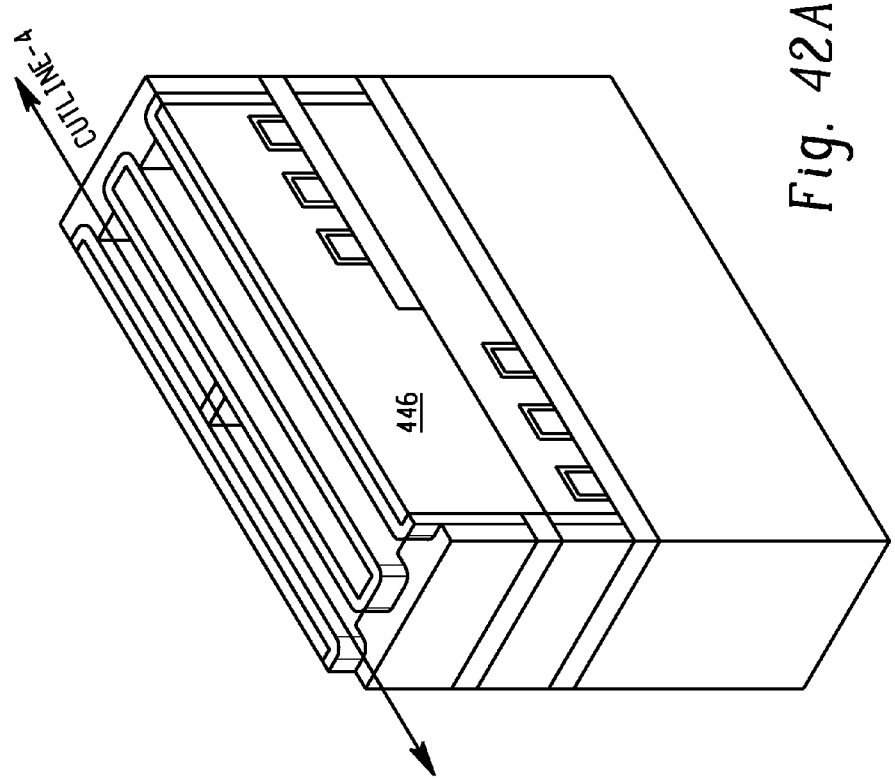

Referring back to FIG. 20, the second level transistor fabrication further comprises BARC removal (operation 364). FIG. 42A depicts an isometric view of a portion of the semiconductor structure after BARC removal. FIG. 42B provides a cross-sectional view of the semiconductor structure from cutline 4 of FIG. 42A. The structures depicted in FIGS. 42A-B are similar to the structures depicted in FIGS. 38A-B except that second buried oxide has been removed in the NMOS region and there is a partial loss of the second layer ILD0 in the NMOS region.

Figure 43B:
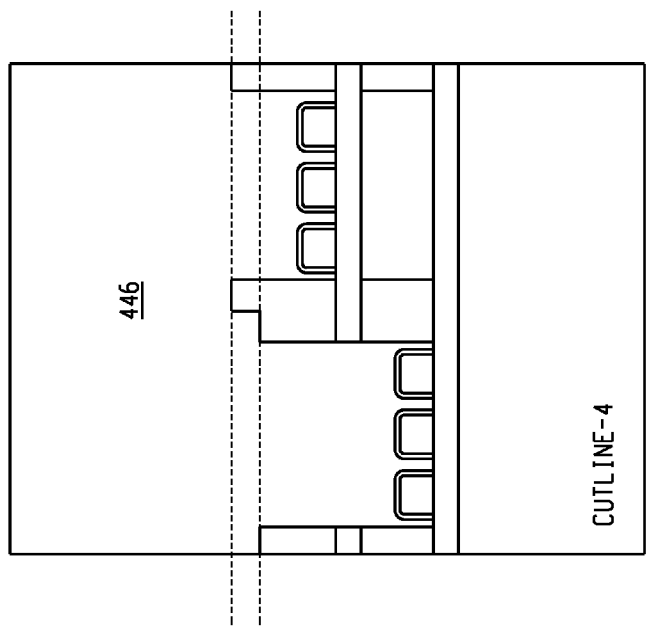
Figure 43A:
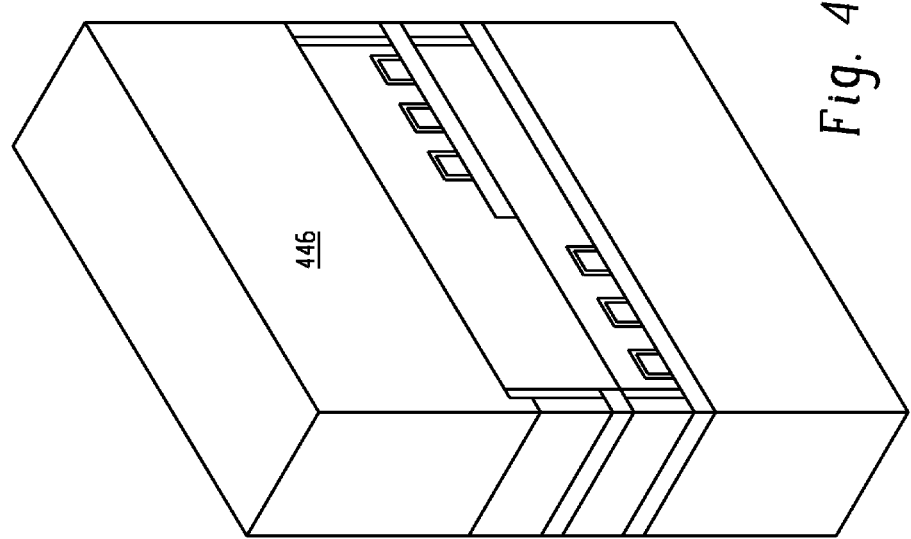

Referring back to FIG. 20, the second level transistor fabrication further comprises M0 deposition (operation 366). FIG. 43A depicts an isometric view of a portion of the semiconductor structure after M0 deposition. FIG. 43B provides a cross-sectional view of the semiconductor structure from cutline 4 of FIG. 43A. FIGS. 43A-B show the deposited M0 446. The M0 may be formed using materials such as W or Cu. Partial M0 material is filled above ILD0 in the NMOS region.

Figure 44B:
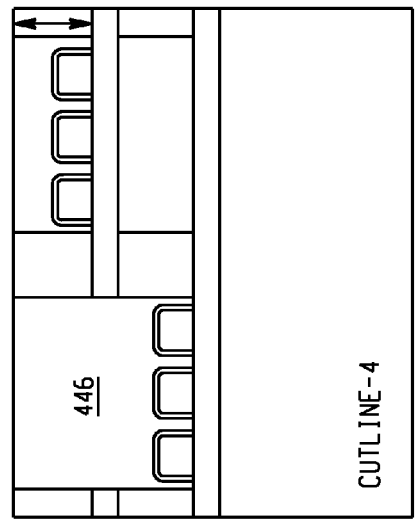
Figure 44A:
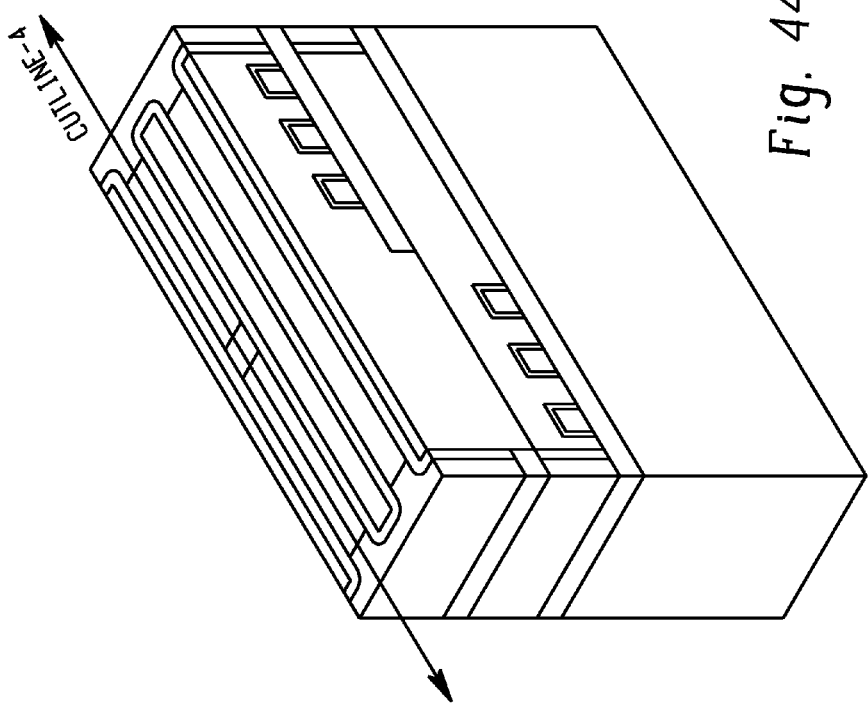

Referring back to FIG. 20, the second level transistor fabrication further comprises M0 CMP (operation 368). FIG. 44A depicts an isometric view of a portion of the semiconductor structure after M0 planarizing. FIG. 44B provides a cross-sectional view of the semiconductor structure from cutline 4 of FIG. 44A. FIGS. 44A-B show the deposited M0 236. The second M0 CMP operation involves polishing to remove the M0 material above the ILD0 in the NMOS region. During this operation, a portion of the gate height of the second layer is reduced. The final gate height will be equal or similar to the gate height of the first layer. The first M0 and the second M0 have been electrically connected through the opening in buried oxide in NMOS region.

After the transistor on the second transistor level is fabricated, back-end-of-line ("BEOL") operations may take place (operation 308), where the individual devices are interconnected with wiring on the multi-layer semiconductor structure. BEOL may include fabrication of contacts, insulating layers (dielectrics), metal levels, and bonding sites for chip-to-package connections.

Figure 45B:
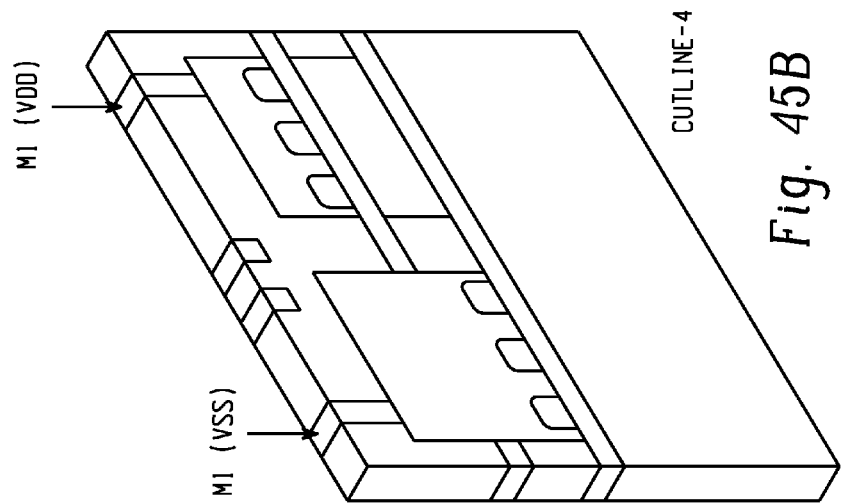
Figure 45A:
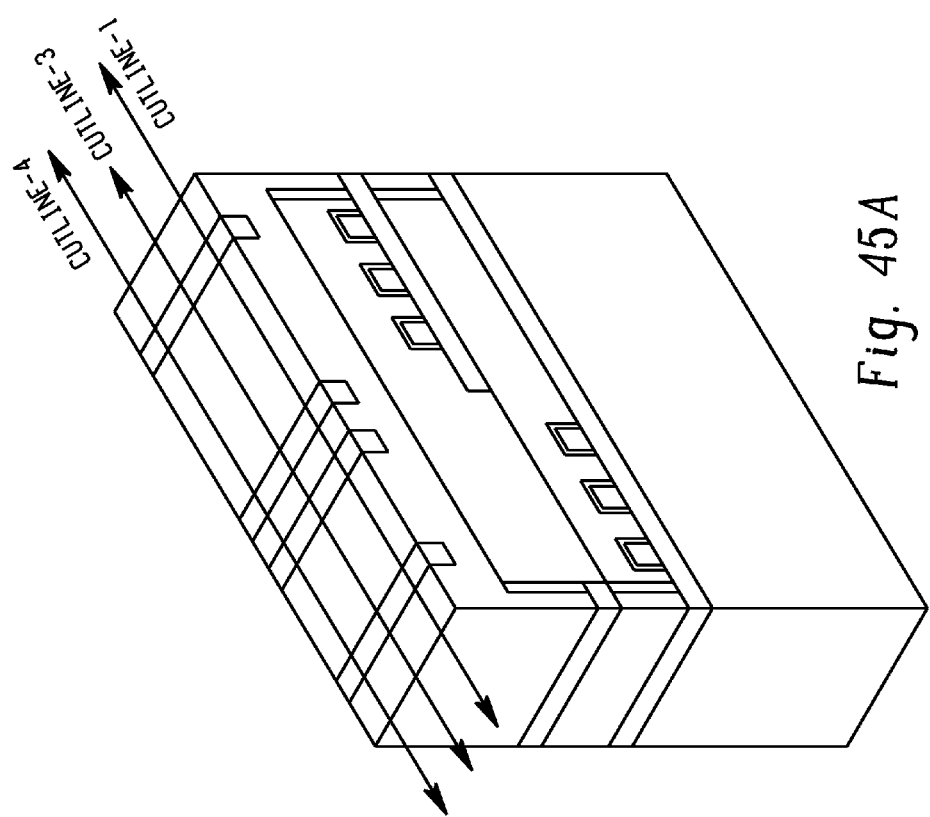
Figure 45D:
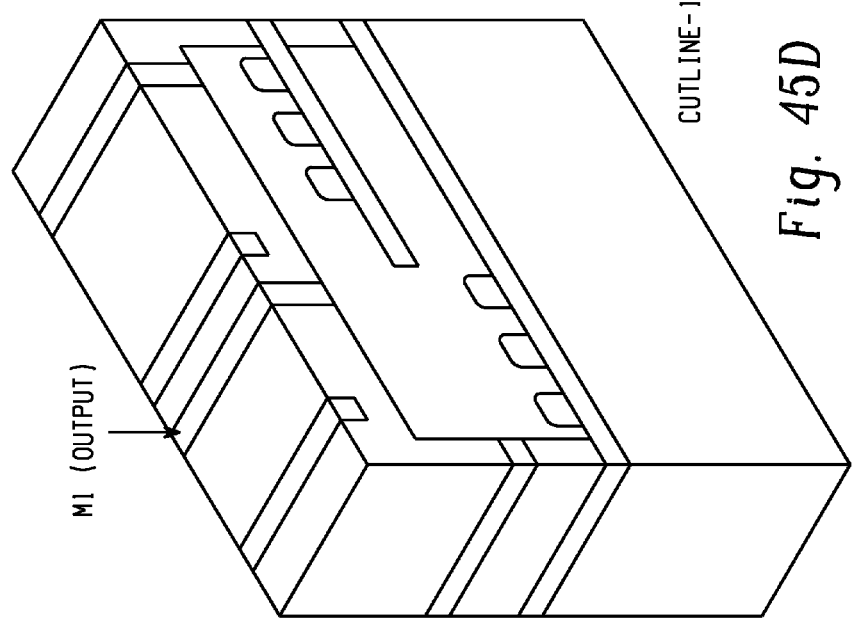
Figure 45C:
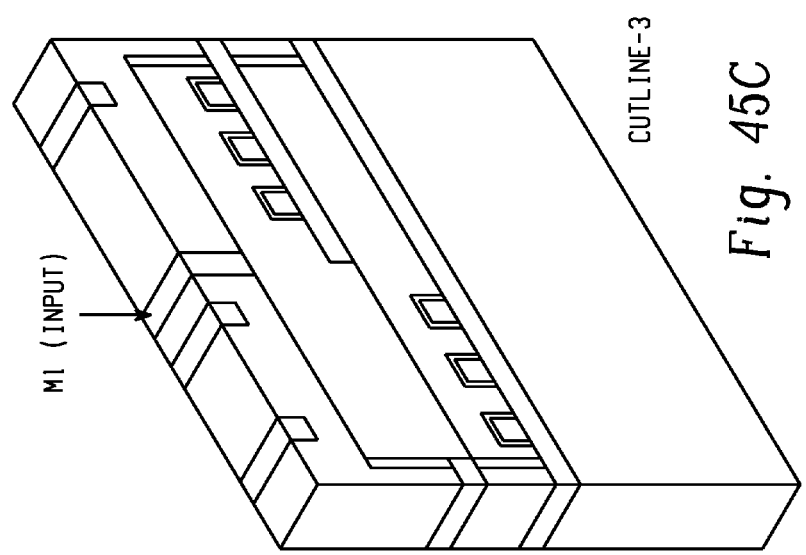

FIG. 45A depicts an isometric view of a portion of the semiconductor structure after the second transistor level is fabricated. FIG. 45B provides a cross-sectional view of the semiconductor structure from cutline 4 of FIG. 45A and shows the source connection of the first transistor. FIG. 45C provides a cross-sectional view of the semiconductor structure from cutline 3 of FIG. 45A and shows the gate connection of the first transistor. FIG. 45D provides a cross-sectional view of the semiconductor structure from cutline 1 of FIG. 45A and shows the drain connection of the first transistor. The source, drain and gate of the first transistor have a direct conduction path to the second layer and the metal contacts without modification of the BEOL operations.

The use of different channel material for NMOS and PMOS transistors may boost the electrical performance for each transistor type This written description uses examples to disclose the invention, include the best mode, and also to enable a person skilled in the art to make and use the invention. The patentable scope of the invention may include other examples that occur to those skilled in the art.

One of ordinary skill in the art will recognize that the various embodiments may be practiced without one or more of the specific details, or with other replacement and/or additional methods, materials, or components. Well-known structures, materials, or operations may not be shown or described in detail to avoid obscuring aspects of various embodiments of the invention. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described herein may be performed in a different order, in series or in parallel, than the described embodiment. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the art will recognize various equivalent combinations and substitutions for various components shown in the figures.

What is claimed is:

1. A method of fabricating a multilayer semiconductor structure having a layout footprint with a first region and a non-overlapping second region and different transistor types fabricated using different channel material, the method comprising:

providing a wafer with first channel material above a buried oxide layer;

transforming the first channel material in the second region to an oxidation layer;

bonding a second buried oxide layer with a second channel material above the second buried oxide layer to the top surface of the first channel material in the first region and the oxidation layer in the second region;

removing the second channel material and the second buried oxide layer from the first region; and fabricating a first transistor type in the first region and a second transistor type in the second region.

2. The method of claim 1, wherein the source, drain and gate terminals of the first transistor are provided with a direct conduction path to the metal contact layer.

3. The method of claim 1, wherein the first transistor is an NMOS transistor and the second transistor is a PMOS transistor.

4. The method of claim 1, wherein the first transistor is a PMOS transistor and the second transistor is an NMOS transistor.

5. The method of claim 1, wherein the first transistor is a FinFET transistor and the second transistor a FinFET transistor.

6. A method of fabricating a multilayer semiconductor structure having a layout footprint with a first region and a non-overlapping second region and different transistor types fabricated using different channel material, the method comprising:

providing a wafer with first channel material above a buried oxide layer;

fabricating a first transistor layer with a first transistor in the first region and the first channel material removed from the second region;

bonding a second buried oxide layer with a second channel material above the second buried oxide layer to the top surface of the fabricated first transistor layer;

fabricating a second transistor layer with a second transistor in the second region and the second channel material removed from the first region; and selectively removing a portion of the second buried oxide layer from the first region to provide a terminal of the first transistor with a direct conduction path to a metal contact layer.

7. The method of claim 6, wherein the source, drain and gate terminals of the first transistor are provided with a direct conduction path to the metal contact layer.

8. The method of claim 6, wherein the first transistor is an NMOS transistor and the second transistor is a PMOS transistor.

9. The method of claim 6, wherein the first transistor is a PMOS transistor and the second transistor is an NMOS transistor.

10. The method of claim 6, wherein the first transistor is a FinFET transistor and the second transistor a FinFET transistor.

11. A method of forming stacked device structure, comprising:

on a substrate, defining a first device region thereon and a second device region laterally offsetting the first device region;

providing a first channel material layer over the substrate in the first device region;

providing a second channel material layer over the substrate in the second device region at an elevation higher than the first channel material layer; and respectively fabricating a first device and a second device from the first channel material layer and the second channel material layer, wherein the first device and the second device vertically offsetting each other and defining an offset region above the first device, thereby reducing parasitic interference there-between.

12. The method of claim 11, wherein fabricating the first device and the second device includes respectively defining a device channel structure in the first device region and the second device region substantially concurrently.

13. The method of claim 12, wherein fabricating the first device and the second device includes respectively forming a fin structure from the first channel material layer and the second channel material layer.

14. The method of claim 12, wherein fabricating the first device and the second device further includes defining, in a single process, a gate structure that concurrently traverses across the first and the second device channel structures.

15. The method of claim 11, wherein providing the first channel material layer in the first device region includes disposing the first channel material layer over the substrate and transforming a selective portion of the first channel material layer into an isolation layer.

16. The method of claim 15, wherein transforming the first channel material layer includes selectively oxidizing the first channel material layer in the second device region.

17. The method of claim 15, wherein providing the second channel material layer includes bonding a buried oxide layer having the second channel material layer disposed thereon to the isolation layer.

18. The method of claim 11, wherein fabricating the first and the second device includes forming a second device channel structure in the second device region subsequent to forming a first device channel structure in the first device region.

19. The method of claim 18, wherein fabricating the first device comprises forming a first gate structure over the first device channel structure, the first gate structure traversing across the first and the second device regions, wherein providing the second channel material layer including bonding a buried oxide layer having the second channel material layer disposed thereon in the second device region over the first gate structure.

20. The method of claim 19, wherein fabricating the second device comprises forming a second gate structure over the second device channel structure, the second gate structure traversing across the first and the second device regions.

21. The method of claim 20, further comprising establishing electrical connection between the first gate structure and the second gate structure through the offset region in the first device region above the first device.

* * * * *